(12) United States Patent
Yamazaki et al.

(10) Patent No.: US 10,374,030 B2
(45) Date of Patent: Aug. 6, 2019

(54) METAL OXIDE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masahiro Takahashi, Kanagawa (JP); Takuya Hirohashi, Kanagawa (JP); Masashi Tsubuku, Kanagawa (JP); Masashi Oota, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/687,061

(22) Filed: Aug. 25, 2017

(65) Prior Publication Data

US 2017/0373135 A1    Dec. 28, 2017

Related U.S. Application Data

(63) Continuation of application No. 15/063,733, filed on Mar. 8, 2016, now Pat. No. 9,748,328, which is a
(Continued)

(30) Foreign Application Priority Data

Dec. 28, 2012    (JP) .................. 2012-288288

(51) Int. Cl.
*H01L 29/00* (2006.01)
*H01L 29/04* (2006.01)
(Continued)

(52) U.S. Cl.
CPC ............ *H01L 29/04* (2013.01); *H01L 29/045* (2013.01); *H01L 29/24* (2013.01); *H01L 29/247* (2013.01);
(Continued)

(58) Field of Classification Search
CPC ....... H01L 29/26; H01L 29/045; H01L 29/04; H01L 29/7869; H01L 29/247; H01L 29/24; H01L 29/78693
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101882630 A | 11/2010 |
| DE | 112011104002 | 8/2013 |

(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, pp. 183-186.

(Continued)

*Primary Examiner* — Nikolay K Yushin
(74) *Attorney, Agent, or Firm* — Fish & Richardson P.C.

(57) ABSTRACT

A highly reliable semiconductor device including an oxide semiconductor is provided. Provided is a semiconductor device including an oxide semiconductor layer, an insulating layer in contact with the oxide semiconductor layer, a gate electrode layer overlapping with the oxide semiconductor layer, and a source electrode layer and a drain electrode layer electrically connected to the oxide semiconductor layer. The oxide semiconductor layer includes a first region having a crystal whose size is less than or equal to 10 nm and a second region which overlaps with the insulating layer with the first region provided therebetween and which includes a crystal part whose c-axis is aligned in a direction parallel to a (Continued)

normal vector of the surface of the oxide semiconductor layer.

21 Claims, 29 Drawing Sheets

Related U.S. Application Data continuation of application No. 14/734,029, filed on Jun. 9, 2015, now Pat. No. 9,293,541, which is a continuation of application No. 14/141,538, filed on Dec. 27, 2013, now Pat. No. 9,064,966.

(51) Int. Cl.
*H01L 29/786* (2006.01)
*H01L 29/24* (2006.01)
*H01L 29/26* (2006.01)

(52) U.S. Cl.
CPC .......... *H01L 29/26* (2013.01); *H01L 29/7869* (2013.01); *H01L 29/78693* (2013.01)

(56) References Cited

U.S. PATENT DOCUMENTS

| | | | |
|---|---|---|---|
| 6,294,274 B1 | 9/2001 | Kawazoe et al. | |
| 6,294,815 B1 * | 9/2001 | Yamazaki | H01L 27/12 257/350 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,521,292 B2 | 4/2009 | Rogers et al. | |
| 7,557,367 B2 | 7/2009 | Rogers et al. | |
| 7,601,984 B2 | 10/2009 | Sano et al. | |
| 7,622,367 B1 | 11/2009 | Nuzzo et al. | |
| 7,674,650 B2 | 3/2010 | Akimoto et al. | |
| 7,732,819 B2 | 6/2010 | Akimoto et al. | |
| 7,781,866 B2 | 8/2010 | Udagawa | |
| 7,799,699 B2 | 9/2010 | Nuzzo et al. | |
| 7,943,491 B2 | 5/2011 | Nuzzo et al. | |
| 7,982,296 B2 | 7/2011 | Nuzzo et al. | |
| 7,994,500 B2 | 8/2011 | Kim et al. | |
| 8,039,847 B2 | 10/2011 | Nuzzo et al. | |
| 8,058,645 B2 | 11/2011 | Jeong et al. | |
| 8,148,779 B2 | 4/2012 | Jeong et al. | |
| 8,178,884 B2 | 5/2012 | Ha et al. | |
| 8,188,480 B2 | 5/2012 | Itai | |
| 8,198,621 B2 | 6/2012 | Rogers et al. | |
| 8,202,365 B2 | 6/2012 | Umeda et al. | |
| 8,203,143 B2 | 6/2012 | Imai | |
| 8,217,381 B2 | 7/2012 | Rogers et al. | |
| 8,274,078 B2 | 9/2012 | Itagaki et al. | |
| 8,309,961 B2 | 11/2012 | Yamazaki et al. | |
| 8,384,077 B2 | 2/2013 | Yano et al. | |
| 8,394,706 B2 | 3/2013 | Nuzzo et al. | |
| 8,421,083 B2 | 4/2013 | Yamazaki et al. | |
| 8,440,546 B2 | 5/2013 | Nuzzo et al. | |
| 8,492,758 B2 | 7/2013 | Yamazaki et al. | |
| 8,530,285 B2 | 9/2013 | Yamazaki et al. | |
| 8,552,434 B2 | 10/2013 | Akimoto et al. | |
| 8,557,641 B2 | 10/2013 | Sasaki et al. | |
| 8,633,480 B2 | 1/2014 | Yamazaki et al. | |
| 8,664,699 B2 | 3/2014 | Nuzzo et al. | |
| 8,669,556 B2 | 3/2014 | Yamazaki et al. | |
| 8,686,425 B2 | 4/2014 | Yamazaki et al. | |
| 8,704,216 B2 | 4/2014 | Godo et al. | |
| 8,709,864 B2 | 4/2014 | Yamazaki et al. | |
| 8,729,524 B2 | 5/2014 | Rogers et al. | |
| 8,748,886 B2 | 6/2014 | Yamazaki et al. | |
| 8,754,396 B2 | 6/2014 | Rogers et al. | |
| 8,846,460 B2 | 9/2014 | Sasaki et al. | |
| 9,029,852 B2 | 5/2015 | Honda et al. | |
| 9,054,134 B2 | 6/2015 | Yamazaki et al. | |
| 9,064,899 B2 | 6/2015 | Godo et al. | |
| 9,105,555 B2 | 8/2015 | Rogers et al. | |
| 9,209,311 B2 | 12/2015 | Ueda et al. | |
| 9,219,160 B2 | 12/2015 | Honda et al. | |
| 9,324,733 B2 | 4/2016 | Rogers et al. | |
| 9,450,043 B2 | 9/2016 | Nuzzo et al. | |
| 9,478,668 B2 | 10/2016 | Takahashi et al. | |
| 9,515,025 B2 | 12/2016 | Rogers et al. | |
| 9,660,102 B2 | 5/2017 | Godo et al. | |
| 9,761,444 B2 | 9/2017 | Nuzzo et al. | |
| 9,768,086 B2 | 9/2017 | Nuzzo et al. | |
| 9,842,859 B2 * | 12/2017 | Koyama | H01L 27/1248 |
| 10,204,864 B2 | 2/2019 | Rogers et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |

(56) References Cited

U.S. PATENT DOCUMENTS

| | | |
|---|---|---|
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0110623 A1* | 5/2010 | Koyama ............ H01L 27/1248 361/679.01 |
| 2010/0320458 A1 | 12/2010 | Umeda et al. |
| 2010/0320459 A1 | 12/2010 | Umeda et al. |
| 2011/0108837 A1 | 5/2011 | Yamazaki et al. |
| 2011/0127521 A1 | 6/2011 | Yamazaki |
| 2011/0127523 A1 | 6/2011 | Yamazaki |
| 2011/0140100 A1 | 6/2011 | Takata et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0138922 A1 | 6/2012 | Yamazaki et al. |
| 2013/0009111 A1 | 1/2013 | Morita et al. |
| 2013/0009209 A1 | 1/2013 | Yamazaki |
| 2013/0009219 A1 | 1/2013 | Yamazaki et al. |
| 2013/0075723 A1 | 3/2013 | Yamazaki et al. |
| 2013/0214273 A1 | 8/2013 | Yamazaki et al. |
| 2013/0248858 A1 | 9/2013 | Morita et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0099752 A1 | 4/2014 | Yamazaki et al. |
| 2014/0124776 A1 | 5/2014 | Takahashi et al. |
| 2014/0231803 A1 | 8/2014 | Yamazaki |
| 2014/0377907 A1 | 12/2014 | Sasaki et al. |
| 2015/0118790 A1 | 4/2015 | Yamazaki et al. |
| 2016/0308068 A1 | 10/2016 | Takahashi et al. |
| 2016/0381789 A1 | 12/2016 | Rogers et al. |
| 2017/0256650 A1 | 9/2017 | Godo et al. |
| 2017/0309733 A1 | 10/2017 | Nuzzo et al. |

FOREIGN PATENT DOCUMENTS

| | | |
|---|---|---|
| EP | 1737044 A | 12/2006 |
| EP | 2159845 A | 3/2010 |
| EP | 2226847 A | 9/2010 |
| EP | 2650905 A | 10/2013 |
| EP | 2650906 A | 10/2013 |
| EP | 2650907 A | 10/2013 |
| EP | 2937896 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-113101 A | 5/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2008-502151 | 1/2008 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-080952 A | 4/2010 |
| JP | 2010-177431 A | 8/2010 |
| JP | 2010-226101 A | 10/2010 |
| JP | 4571221 | 10/2010 |
| JP | 2011-029630 A | 2/2011 |
| JP | 2011-119718 A | 6/2011 |
| JP | 2011-119720 A | 6/2011 |
| JP | 2012-134475 A | 7/2012 |
| JP | 2012-160679 A | 8/2012 |
| KR | 2010-0027067 A | 3/2010 |
| KR | 2012-0106743 A | 9/2012 |
| TW | 200633266 | 9/2006 |
| TW | 201029184 | 8/2010 |
| TW | 201135941 | 10/2011 |
| TW | 201236157 | 9/2012 |
| TW | 201249752 | 12/2012 |
| TW | 201250863 | 12/2012 |
| WO | WO-2004/114391 | 12/2004 |
| WO | WO-2005/122285 | 12/2005 |
| WO | WO-2006/054737 | 5/2006 |
| WO | WO-2006/130721 | 12/2006 |
| WO | WO-2008/030960 | 3/2008 |
| WO | WO-2008/133345 | 11/2008 |
| WO | WO-2009/034953 | 3/2009 |
| WO | WO-2011/001879 | 1/2011 |
| WO | WO-2011/027467 | 3/2011 |
| WO | WO-2011/055620 | 5/2011 |
| WO | WO-2011/055769 | 5/2011 |
| WO | WO-2011/081009 | 7/2011 |
| WO | WO-2012/073844 | 6/2012 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2013/085020) dated Feb. 4, 2014.

Written Opinion (Application No. PCT/JP2013/085020) dated Feb. 4, 2014.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Tokumaru.R et al., "Recognition of Existence of n-type IGZO Layer in CAAC-IGZO Film under Source and Drain Electrode Made of Tungsten", SID Digest '13 : SID International Symposium Digest of Technical Papers, 2013, pp. 1022-1025.

Okamoto.Y et al., "Novel Application of Crystalline Indium-Gallium-Zinc-Oxide Technology to LSI:Dynamically Reconfigurable Programmable Logic Device Based on Multi-Context Architecture", ECS Transactions, Jul. 7, 2013, vol. 54, No. 1, pp. 141-149, The Electrochemical Society.

Matsubayashi.D et al., "Conduction Band Lowering Effect in Crystalline Indium-Gallium-Zinc-Oxide Thin Film Transistors", ECS Transactions, 2013, vol. 54, No. 1, pp. 115-120, The Electrochemical Society.

Kobayashi.Y et al., "Scaling to 100nm Channel Length of Crystalline In-Ga-Zn-Oxide Thin Film Transistors with Extremely Low Off-State Current", SSDM 2013 (Extended Abstracts of the 2013 International Conference on Solid State Devices and Materials), Sep. 24, 2013, pp. 930-931.

Taiwanese Office Action (Application No. 102147521) dated May 12, 2017.

Taiwanese Office Action (Application No. 106135626) dated Aug. 23, 2018.

Shimizu.M et al., "The formation of an Fe2O3-YIG film formed by sputtering", The 140th Annual Meeting: The Japan Institute of Metals and Materials, Mar. 27, 2007, p. 361.

\* cited by examiner

FIG. 3A
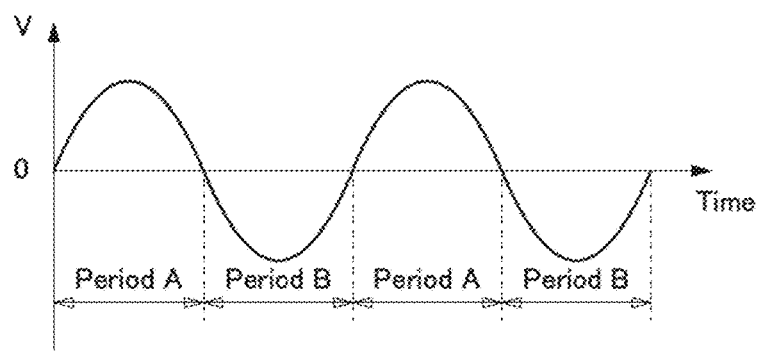
FIG. 3B1 
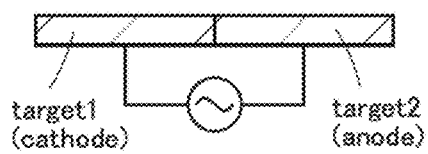
FIG. 3B2
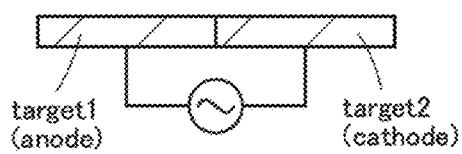
FIG. 3C
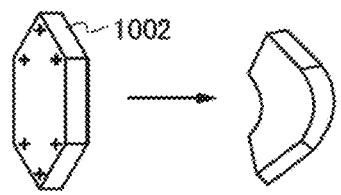

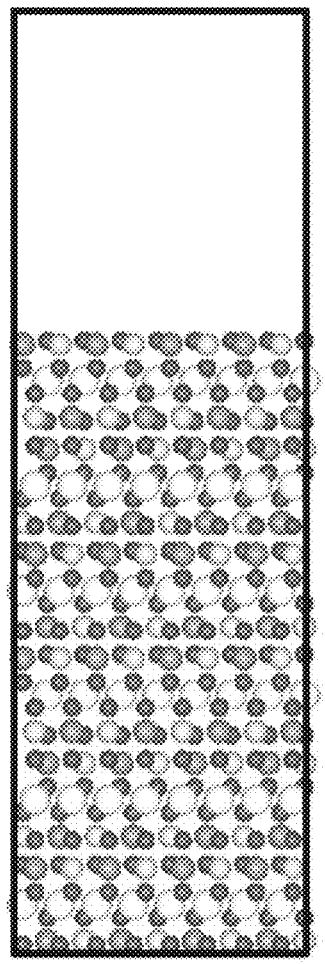
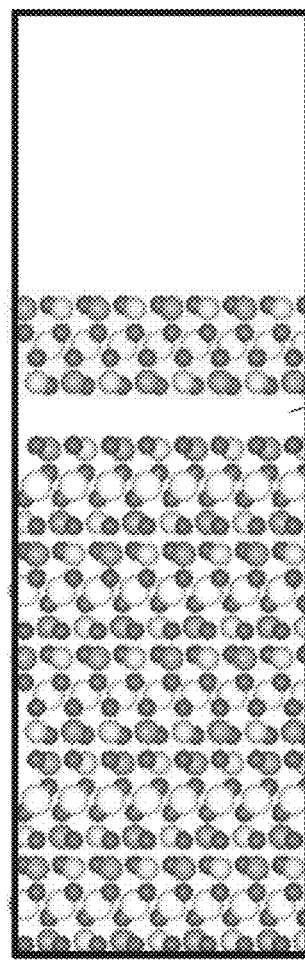
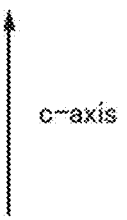
FIG. 6A before ion collision
FIG. 6B after ion collision

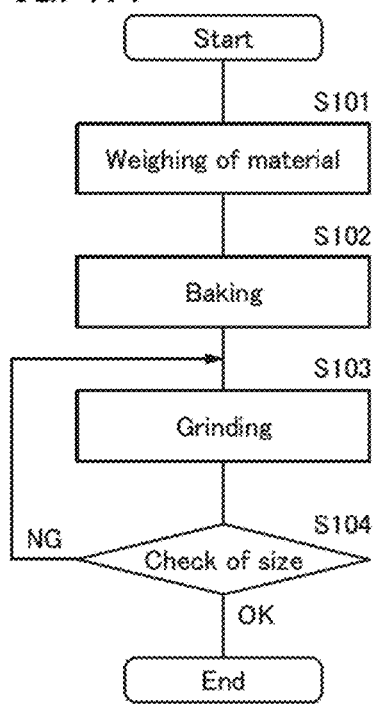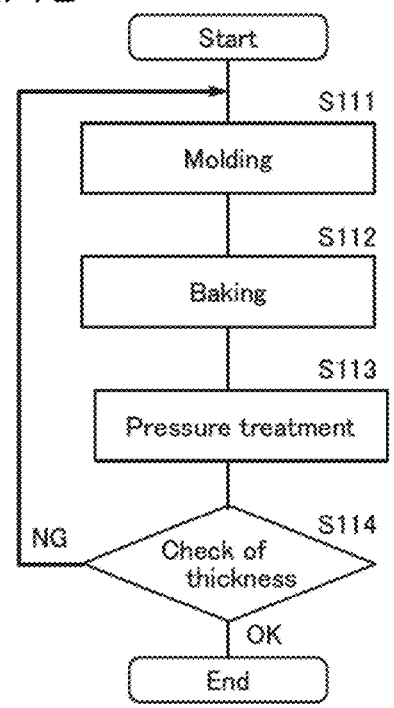

METAL OXIDE SEMICONDUCTOR DEVICE

CROSS-REFERENCE TO RELATED APPLICATIONS

This application is a continuation of U.S. application Ser. No. 15/063,733, filed Mar. 8, 2016, now allowed, which is a continuation of U.S. application Ser. No. 14/734,029, filed Jun. 9, 2015, now U.S. Pat. No. 9,293,541, which is a continuation of U.S. application Ser. No. 14/141,538, filed Dec. 27, 2013, now U.S. Pat. No. 9,064,966, which claims the benefit of a foreign priority application filed in Japan as Serial No. 2012-288288 on Dec. 28, 2012, all of which are incorporated by reference.

TECHNICAL FIELD

The present invention disclosed in this specification relates to an object, a method, a manufacturing method, a process, a machine, manufacture, or a composition of matter. In particular, the present invention relates to, for example, a semiconductor device, a display device, a light-emitting device, a power storage device, a driving method thereof, or a manufacturing method thereof. For example, the present invention relates to a semiconductor device including an oxide semiconductor, a display device including an oxide semiconductor, or a light-emitting device including an oxide semiconductor.

In this specification and the like, a "semiconductor device" generally refers to a device which can function by utilizing semiconductor characteristics: an electro-optical device, a semiconductor circuit, a display device, a light-emitting device, and an electronic device are all included in the category of the semiconductor device.

BACKGROUND ART

A technique by which a transistor is formed using a semiconductor film formed over a substrate having an insulating surface has been attracting attention. The transistor is applied to a wide range of electronic devices such as an integrated circuit (IC) and an image display device (also simply referred to as display device). As a semiconductor film applicable to the transistor, a silicon-based semiconductor material is widely known: moreover, a metal oxide exhibiting semiconductor characteristics (an oxide semiconductor) has been attracting attention as another material.

For example, Patent Document 1 discloses a technique in which a transistor is manufactured using an amorphous oxide containing In Zn, Ga, Sn, and the like as an oxide semiconductor.

Although a transistor including an oxide semiconductor film can obtain transistor characteristics relatively with ease, the oxide semiconductor film is likely to be amorphous and has unstable physical properties. Thus, it is difficult to secure reliability of such a transistor.

On the other hand, there is a report that a transistor including a crystalline oxide semiconductor film has more excellent electrical characteristics and higher reliability than a transistor including an amorphous oxide semiconductor film (see Non-Patent Document 1).

REFERENCE

Patent Document

[Patent Document 1] Japanese Published Patent Application No. 2006-165529

Non-Patent Document

[Non-Patent Document 1] Shunpei Yamazaki Jun Koyama, Yoshitaka Yamatnoto, and Kenji Okamoto, "Research, Development, and Application of Crystalline Oxide Semiconductor", *SID* 2012 *DIGEST, pp.* 183-186

DISCLOSURE OF INVENTION

An object of one embodiment of the present invention is to provide a highly reliable semiconductor device including an oxide semiconductor.

Another object of one embodiment of the present invention is to provide a transistor or the like having a low off-state current. Another object of one embodiment of the present invention is to provide a transistor or the like having normally-off characteristics. Another object of one embodiment of the present invention is to provide a transistor or the like whose threshold voltage is less likely to vary or deteriorate. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like including a transparent semiconductor layer. Another object of one embodiment of the present invention is to provide a novel semiconductor device or the like.

Note that the descriptions of these objects do not disturb the existence of other objects. Note that one embodiment of the present invention does not necessarily achieve all the objects. Other objects will be apparent from and can be derived from the description of the specification, the drawings, the claims, and the like.

One embodiment of the disclosed invention is a semiconductor device including an oxide semiconductor layer and an insulating layer in contact with the oxide semiconductor layer. The oxide semiconductor layer includes a first region having a crystal whose size is less than or equal to 10 nm and a second region which overlaps with the insulating layer with the first region provided therebetween and which includes a crystal part whose c-axis is aligned in a direction parallel to a normal vector of the surface of the oxide semiconductor layer. Specifically, one embodiment of the disclosed invention is, for example, a semiconductor device having any of the following structures.

One embodiment of the present invention is a semiconductor device including an oxide semiconductor layer, an insulating layer in contact with the oxide semiconductor layer, a gate electrode layer overlapping with the oxide semiconductor layer, and a source electrode layer and a drain electrode layer electrically connected to the oxide semiconductor layer. The oxide semiconductor layer includes a first region having a crystal whose size is less than or equal to 10 nm and a second region which overlaps with the insulating layer with the first region provided therebetween and which includes a crystal part whose c-axis is aligned in a direction parallel to a normal vector of the surface of the oxide semiconductor layer.

In the above semiconductor device, oxide semiconductors included in the first region and the second region may have different compositions.

Another embodiment of the present invention is a semiconductor device including a first insulating layer, an oxide semiconductor layer over the first insulating layer, a second insulating layer over the oxide semiconductor layer, a gate electrode layer overlapping with the oxide semiconductor layer, and a source electrode layer and a drain electrode layer electrically connected to the oxide semiconductor layer. The oxide semiconductor layer includes a first region having a crystal whose size is less than or equal to 10 nm, a second region which overlaps with the first insulating layer with the first region provided therebetween and which includes a crystal part whose c-axis is aligned in a direction parallel to a normal vector of the surface of the oxide semiconductor layer, and a third region which is located between the second region and the second insulating layer and which has a crystal whose size is less than or equal to 10 nm.

In the above semiconductor device, oxide semiconductors included in the first region and the second region may have different compositions, and oxide semiconductors included in the second region and the third region may have different compositions.

In the above semiconductor device, in the third region, in some cases, a plurality of circumferentially distributed spots are observed by nanobeam electron diffraction in which a diameter of an electron beam is reduced to 1 nmϕ or more and 10 nmϕ or less, and a halo pattern is observed by selected-area electron diffraction using a transmission electron microscope where a diameter of an electron beam is 300 nmϕ or more.

Further, in the above semiconductor device, in the first region, in some cases, a plurality of circumferentially distributed spots are observed by nanobeam electron diffraction in which a diameter of an electron beam is reduced to 1 nmϕ or more and 10 nmϕ or less, and a halo pattern is observed by selected-area electron diffraction using a transmission electron microscope where a diameter of an electron beam is 300 nmϕ or less.

Moreover, in the above semiconductor device, a film density of the second region is preferably higher than a film density of the first region.

In the above semiconductor device, a channel is preferably formed in the second region.

In accordance with one embodiment of the present invention, a highly reliable semiconductor device can be provided.

BRIEF DESCRIPTION OF DRAWINGS

FIGS. 3A, 3B1 and 3B2, and 3C are diagrams describing a discharge state when sputtering is performed using an AC power source.

FIGS. 6A and 6B each illustrate a crystal structure of an oxide semiconductor of one embodiment of the present invention.

FIGS. 7A and 7B are flow charts exemplifying a method for manufacturing a sputtering target.

BEST MODE FOR CARRYING OUT THE INVENTION

Figure 1A:
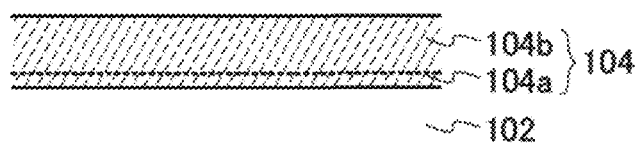
FIGS. 1A to 1C are schematic views each exemplifying a stacked-layer structure of a semiconductor device of one embodiment of the present invention.

Embodiments and examples of the present invention are described in detail below with reference to the accompanying drawings. However, the present invention is not limited to the description below and it is easily understood by those skilled in the art that modes and aspects thereof can be modified in various ways. Therefore, the present invention is not construed as being limited to description of the embodiments and examples.

Note that in each drawing described in this specification, the size, the film thickness, or the region of each component is exaggerated for clarity in some cases. Therefore, the scale is not necessarily limited to that illustrated in the drawings.

Note that the ordinal numbers such as "first" and "second" in this specification and the like are used for convenience and do not denote the order of steps, the stacking order of layers, or the like. In addition, the ordinal numbers in this specification and the like do not denote particular names which specify the present invention.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

Embodiment 1

In this embodiment, an oxide semiconductor layer included in a semiconductor device of one embodiment of the present invention will be described with reference to FIGS. 1A to 1C.

<Stacked-Layer Structure of Oxide Semiconductor Layer>

FIG. 1A is a schematic view exemplifying a stacked-layer structure of a semiconductor device of one embodiment of the present invention. The semiconductor device of one embodiment of the present invention includes an oxide semiconductor layer 104 in contact with a top surface of an insulating layer 102.

The oxide semiconductor layer 104 includes a first region 104a and a second region 104b overlapping with the insulating layer 102 with the first region 104a provided therebetween.

In the oxide semiconductor layer 104, both the first region 104a and the second region 104b are crystalline regions and have different crystallinity. Specifically, crystallinity of the second region 104b is higher than that of the first region 104a.

As a crystalline oxide semiconductor, for example, a single crystal oxide semiconductor, a c-axis aligned crystalline oxide semiconductor (CAAC-OS), an oxide semiconductor including a polycrystal (hereinafter referred to as a polycrystalline oxide semiconductor), and an oxide semiconductor including a microcrystal (also referred to as a nanocrystal) (hereinafter referred to as a nanocrystalline oxide semiconductor) can be given.

In the oxide semiconductor layer 104 of this embodiment, the first region 104a preferably includes a crystal (nanocrystal (nc)) whose size is greater than or equal to 1 nm and less than or equal to 10 nm, for example.

The nanocrystalline oxide semiconductor film is a dense film whose film density is higher than that of an amorphous oxide semiconductor film. Thus, in the oxide semiconductor layer 104, the density of defect states of the first region 104a including a nanocrystal is lower than that of an amorphous oxide semiconductor film.

Note that in this specification, an amorphous oxide semiconductor film has disordered atomic arrangement and no crystalline component. A typical example thereof is an oxide semiconductor film in which no crystal part exists even in a microscopic region, and the whole of the film is amorphous.

The second region 104b preferably includes a crystal part whose c-axis is aligned in a direction parallel to a normal vector of a surface over which the oxide semiconductor layer 104 is formed or a normal vector of a surface of the oxide semiconductor layer 104. An example of such an oxide semiconductor film is a CAAC-OS film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. In a transmission electron microscope (TEM) image of the CAAC-OS film, a boundary between crystal parts, that is, a grain boundary is not clearly observed. Thus, in the CAAC-OS film, a reduction in electron mobility due to the gain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is in some cases higher than that in the vicinity of the formation surface. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is a dense film whose film density is much higher than that of a nanocrystalline oxide semiconductor film. Thus, in the oxide semiconductor layer 104, the density of defect states of the second region 104b including a CAAC-OS is lower than that of the first region 104a including a nanocrystal.

The oxide semiconductor layer 104 shown in this embodiment includes the first region 104a including a nanocrystal which is an oxide semiconductor in which defect state density is reduced, and the second region 104b including a CAAC-OS which is an oxide semiconductor in which density of defect states is much lower than that of a nanocrystalline oxide semiconductor.

In a semiconductor device including an oxide semiconductor layer, it is necessary to reduce defect states of the oxide semiconductor layer that functions as a channel and the interface thereof so that the reliability can be improved. In a transistor including an oxide semiconductor layer, a shift of threshold voltage in the negative direction occurs particularly because of defect states due to oxygen vacancies in the oxide semiconductor layer that functions as a channel and oxygen vacancies in the interface thereof.

Thus, with the use of the oxide semiconductor layer 104 including a region in which defects states are reduced for a transistor as shown in this embodiment, a change in electrical characteristics of the transistor due to irradiation of visible light or ultraviolet light can be suppressed. Therefore, the reliability of the transistor can be improved.

In the case where the oxide semiconductor layer 104 is used for a transistor, it is preferable to use the second region 104b including a CAAC-OS in which defect states are further reduced for a main current path (channel) of the transistor. Moreover, in the case where the second region 104b functions as a main current path of the transistor, the structure in which the first region 104a is provided at the interface between the insulating layer 102 and the second region 104b has an effect of suppressing formation of a defect state at the interface between the channel and the insulating layer 102.

Further, even when the second region 104b functions as a main current path in the oxide semiconductor layer 104, a certain amount of current sometimes flows also in the first region 104a. Since the first region 104a of the oxide semiconductor layer 104 shown in this embodiment also includes a nanocrystalline oxide semiconductor in which defect state density is lower, the reliability can be improved as compared to the case where the first region 104a includes an amorphous oxide semiconductor.

Note that a stacked-layer structure of the semiconductor device of one embodiment of the present invention is not limited to the structure of FIG. 1A. For example, a structure in which an insulating layer 106 is provided over an oxide semiconductor layer 114 as illustrated in FIG. 1B may be employed.

Figure 1B:

In FIG. 1B, the oxide semiconductor layer 114 under the insulating, layer 106 includes a first region 114a including a nanocrystal over a second region 114b including a CAAC-OS. In other words, in FIG. 1B, the oxide semiconductor layer 114 includes the first region 114a and the second region 114b overlapping with the insulating layer 106 with the first region 114a provided therebetween in a manner similar to that of FIG. 1A.

Figure 1C:
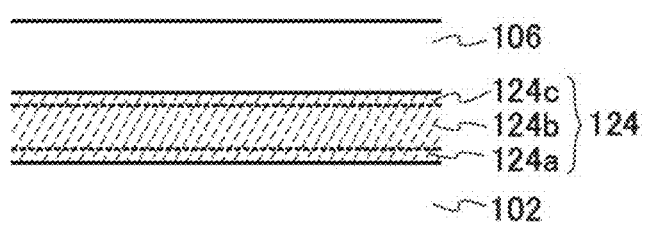

Alternatively, as illustrated in FIG. 1C, a structure including an oxide semiconductor layer 124 over the insulating layer 102 and the insulating layer 106 over the oxide semiconductor layer 124 may have a stacked-layer structure in which the oxide semiconductor layer 124 includes a first region 124a including a nanocrystal, a second region 124b overlapping with the insulating layer 102 with the first region 124a provided therebetween and including a CAAC-OS, and a third region 124c being located between the second region 124b and the insulating layer 106 and including a nanocrystal.

The oxide semiconductor layer 114 in FIG. 1B and the oxide semiconductor layer 124 in FIG. 1C as well as the oxide semiconductor layer 104 in FIG. 1A are each an oxide semiconductor layer which includes a region including a nanocrystal and a region including a CAAC-OS and in which defect states are reduced. Thus, with the use of such an oxide semiconductor layer for a transistor, a highly reliable transistor in which a change in electrical characteristics is suppressed can be provided.

Further, as well as the stacked-layer structure in FIG. 1A, the stacked-layer structure in FIG. 1B includes the first region 114a including a nanocrystal provided between the second region 114b including a CAAC-OS and the insulating layer 106. Similarly, the stacked-layer structure in FIG. 1C includes the first region 124a including a nanocrystal provided between the second region 124b including a CAAC-OS and the insulating, layer 102 and the third region 124c including a nanocrystal provided between the second region 124b including a CAAC-OS and the insulating layer 106. With such structures, in the case where the second region 114b functions as a channel in a transistor including the oxide semiconductor layer 114, direct contact between the channel and the insulating layer 106 in contact with the oxide semiconductor layer 114 can be suppressed; and in the case where the second region 124b functions as a channel in a transistor including the oxide semiconductor layer 124, direct contact between the channel and the insulating layer 106 or the insulating layer 102 in contact with the oxide semiconductor layer 124 can be suppressed. Accordingly in each case, a defect state can be prevented from being formed at the interface of the channel. Thus, the reliability of the transistors can be improved.

Note that the oxide semiconductor layers 104, 114, and 124 illustrated in FIGS. 1A, 1B, and 1C, respectively, may each include a single crystal region or an amorphous region.

For example, in FIG. 1A, the oxide semiconductor layer 104 may include an amorphous region over the second region 104b. Alternatively, in FIG. 1B, the oxide semiconductor layer 114 may include an amorphous region under the second region 114b.

The first region 104a and the second region 104b included in the oxide semiconductor layer 104 in FIG. 1A may each have a structure in which a single-layer film includes regions having different crystallinity or a structure in which films having different crystallinity are stacked. In other words, in this specification and the like, a term "region" can be alternatively referred to as a "layer" unless otherwise described. For example, the oxide semiconductor layer 104 may have a stacked-layer structure of a first oxide semiconductor layer including a nanocrystal and a second oxide semiconductor layer including a CAAC-OS.

Note that in the case where the oxide semiconductor layer 104 has a stacked-layer structure of the first oxide semiconductor layer including a nanocrystal and the second oxide semiconductor layer including a CAAC-OS, metal elements included in the first oxide semiconductor layer and the second oxide semiconductor layer may be the same or different. Alternatively, in the case where the same metal elements are included, the compositions thereof may be the same or different. The same applies to the oxide semiconductor layer 114 and the oxide semiconductor layer 124.

The oxide semiconductor layers shown in this embodiment each include a region including a nanocrystal at the interface between an insulating layer and a region including a CAAC-OS that functions as a main current path. Thus, the reliability of the transistors including the oxide semiconductor layers can be improved.

Note that although the oxide semiconductor layers shown in this embodiment can be each included in, for example, an active layer of the transistor, an embodiment of the present invention is not limited to such use. The oxide semiconductor layer shown in this embodiment can be included as some of various elements. For example, the oxide semiconductor layer shown in this embodiment can be included as part of a resistor. The resistor can be included in a protection circuit. Alternatively, for example, the oxide semiconductor layer shown in this embodiment can be included as part of an electrode of a capacitor. The capacitor can be included as a storage capacitor in a pixel or a capacitor in a driver circuit. In the case where the oxide semiconductor layer shown in this embodiment is included in a transistor, a capacitor, or a resistor, other oxide semiconductor layers included in these elements may be formed at the same time. Such a case is preferable because the number of process steps can be reduced. Note that in the case where the oxide semiconductor layer shown in this embodiment is included in a capacitor or a resistor, hydrogen or the like can be introduced into the film to lower the resistance value. Accordingly, the resistance value of the oxide semiconductor layer shown in this embodiment can be lowered in such a manner that a film containing hydrogen, such as a silicon nitride film, is made in contact with the oxide semiconductor layer shown in this embodiment.

The methods and structures described in this embodiment can be combined as appropriate with any of the methods and structures described in the other embodiments.

Embodiment 2

In this embodiment, film formation of a crystal part included in the oxide semiconductor layer described in Embodiment 1 will be described with reference to FIGS. 2A and 2B, FIGS. 3A to 3C, FIG. 4, FIG. 5, and FIGS. 6A and 6B. Note that the following model is first a consideration, and an embodiment of the present invention is not limited thereto.

<Film Formation Model of Crystal Part>

Figure 2A:
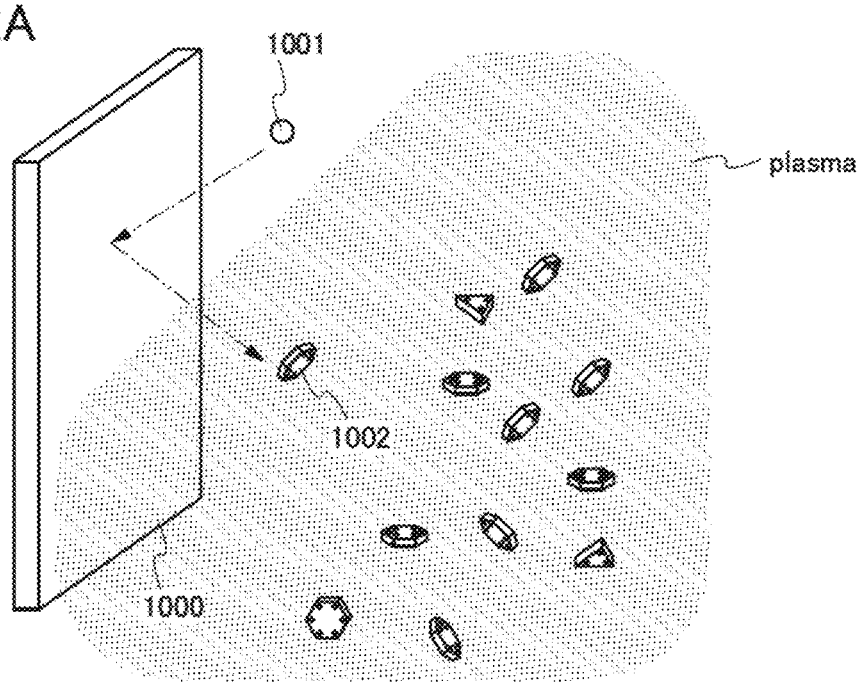
FIGS. 2A and 2B are schematic views illustrating sputtered particles separated from a sputtering target.
Figure 2B:
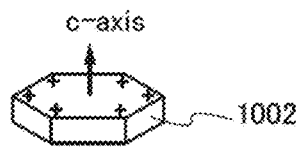

FIG. 2A is a schematic view illustrating a state in which an ion 1001 collides with a sputtering target 1000 to separate sputtered particles 1002 from the sputtering target 1000 at the deposition of the oxide semiconductor layer. FIGS. 2A and 2B illustrate the case where the sputtered particle 1002 has the shape of a hexagonal cylinder whose hexagonal planes are parallel to an a-b plane or the case where the sputtered particle 1002 has the shape of a triangular prism whose triangular planes are parallel to an a-b plane. In the case where the sputtered particle 1002 has the shape of the hexagonal cylinder, the direction perpendicular to the hexagonal planes is a c-axis direction (see FIG. 2B). Note that the same applies to the case of the shape of a triangular prism. The diameter (equivalent circle diameter) of the plane of the sputtered particle 1002 which is parallel to the a-b plane is approximately greater than or equal to 1 nm and less than or equal to 30 nm car greater than or equal to 1 nm and less than or equal to 10 nm, though it differs depending on the kind of oxide semiconductor to be used. Note that an oxygen cation is used as the ion 1001. An argon cation may be used in addition to the oxygen cation. Note that a cation of another rare gas may be used instead of an argon cation.

With the use of an oxygen cation as the ion 1001, plasma damage at the deposition can be alleviated. Thus, when the ion 1001 collides with the surface of the sputtering target 1000, a lowering in crystallinity of the sputtering target 1000 can be suppressed or a change of the sputtering target 1000 into amorphous state can be suppressed.

It is preferable that the separated sputtered particles 1002 be positively charged. However, there is no particular limitation on the timing at which the sputtered particles 1002 are positively charged. Specifically, the sputtered particle 1002 is in some cases positively charged by being exposed to plasma. Alternatively, the sputtered particle 1002 is in some cases positively charged by receiving an electric charge at the collision of the ion 1001. Further alternatively, the sputtered particle 1002 is in some cases positively charged in such a manner that the ion 1001 which is an oxygen cation is bonded to a side, top, or bottom surface of the sputtered particle 1002.

In the sputtered particle 1002, the corners of the polygonal plane are positively charged, whereby positive charges of the hexagonal plane repel each other. Thus, flat-plate shapes of the sputtered particles 1002 can be maintained.

It is preferable to use a direct-current (DC) power source to positively charge the corners of the polygonal plane of the sputtered particle 1002. Note that a radio frequency (RF) power source or an alternating-current (AC) power source can also be used. Note that it is difficult to use an RF power source for a sputtering apparatus which is capable of performing deposition to a large-sized substrate. In addition, a DC power source is preferred to an AC power source from the viewpoint below.

In the AC power source, adjacent targets alternately have a cathode potential and an anode potential. In a period A shown in FIG. 3A, a target 1 functions as a cathode and a target 2 functions as an anode as illustrated in FIG. 3B1. In a period B shown in FIG. 3A, the target 1 functions as an anode and the target 2 functions as a cathode as illustrated in FIG. 3B2. The total time of the period A and the period B is 20 microseconds to 50 microseconds and the period A and the period B are repeated at a constant frequency.

In the case where the sputtered particle 1002 is positively charged, positive charges in the sputtered particle 1002 repel each other, whereby flat-plate shapes of the sputtered particles 1002 can be maintained. However, in the case where the AC power source is used, there is time during which an electric field is not applied instantaneously therefore, some charges of the sputtered particle 1002 are lost and the structure of the sputtered particle might be broken (see FIG. 3C). Thus, a DC power source is preferred to an AC power source.

<<Deposition of CAAC-OS>>

A state in which sputtered particles are deposited on a deposition surface is described below with reference to FIG. 4. Note that FIG. 4 illustrates the case where deposition is performed in the sate where a substrate is heated.

Figure 4:
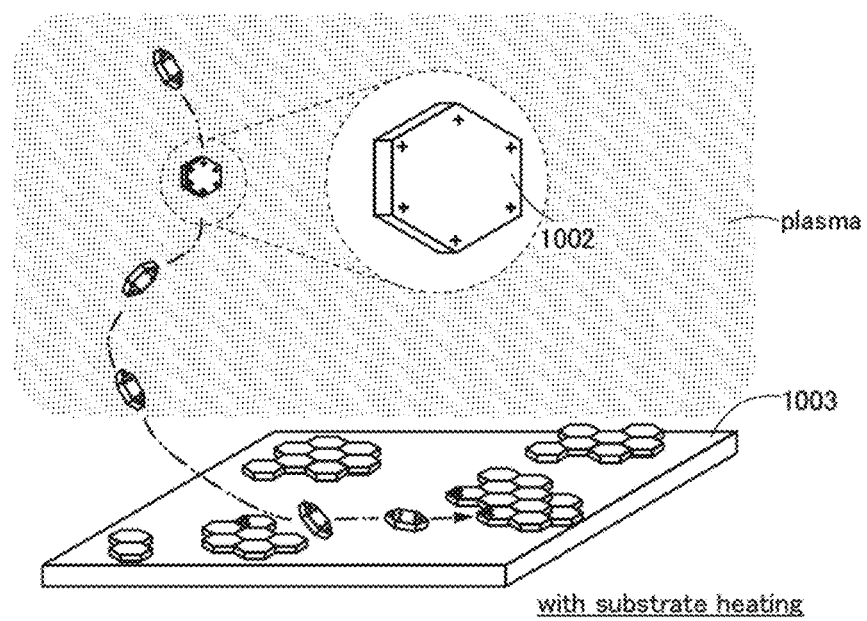
FIG. 4 is a schematic diagram illustrating a state in which sputtered particles reach a deposition surface at the substrate heating.

As illustrated in FIG. 4, in the case of substrate heating, one sputtered particle 1002 moves to a region of a deposition surface 1003 where other sputtered particles 1002 have not been deposited yet and migration of the sputtered particle 1002 occurs, whereby the sputtered particle 1002 is bonded to the side of the sputtered particles which are already deposited. In this manner, the sputtered particles 1002 are spread with flat plate planes facing upward. The c-axes of the deposited sputtered particles 1002 are aligned in one direction perpendicular to the deposition surface 1003; accordingly, a CAAC-OS film is obtained. Moreover, an oxide semiconductor layer having a uniform thickness and a uniform crystal orientation is formed with an oxide film obtained by the deposition.

The CAAC-OS film obtained by such a mechanism has high crystallinity even on an amorphous surface, an amorphous insulating surface, a surface of an amorphous oxide film, or the like.

<<Deposition of Nanocrystalline Oxide Semiconductor>>

Figure 5:
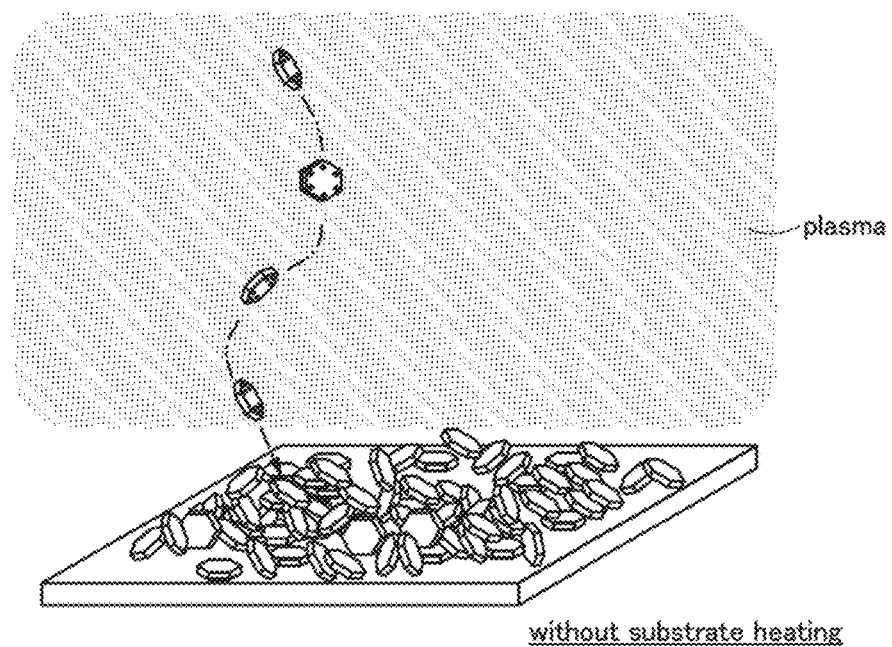
FIG. 5 is a schematic diagram illustrating a state in which sputtered particles reach a deposition surface at the deposition at room temperature.

FIG. 5 illustrates a state in which sputtered particles are deposited on a deposition surface in the case where deposition is performed without substrate heating.

According to FIG. 5, in the case without substrate heating (e.g., the case where the substrate temperature is room temperature ±50° C., preferably room temperature ±10° C.), the sputtered particles 1002 fall irregularly to the deposition surface 1003. Thus, the sputtered particles 1002 are deposited randomly also in a region where other sputtered particles 1002 are already deposited. That is, an oxide semiconductor layer obtained by the deposition has neither a uniform thickness nor a uniform crystal orientation. The oxide semiconductor layer obtained in such a manner is an oxide semiconductor layer including a crystal part because the crystallinity of flat plate-like sputtered particles 1002 is maintained to some extent.

As described above, the diameter of the plane of the sputtered particle 1002 which is parallel to the a-b plane is, for example, approximately greater than or equal to 1 nm and less than or equal to 30 nm or greater than or equal to 1 nm and less than or equal to 10 nm, and a crystal part included in the deposited oxide semiconductor layer is smaller than the sputtered particle 1002 in some cases. The oxide semiconductor layer includes a crystal part with a size of, for example, 10 nm or less or 5 nm or less in some cases, which is a nanocrystalline oxide semiconductor layer.

The nanocrystalline oxide semiconductor layer is macroscopically equivalent to a film having disordered atomic arrangement. For this reason, in some cases, a peak indicating an orientation is not observed in X-ray diffraction (XRD) analysis which is performed on a large area of a measurement sample (for example, in which the beam diameter is larger than that of the sputtered particle 1002). Further, in some cases, an electron diffraction pattern obtained by using an electron beam with a diameter larger than that of the sputtered particle 1002 is a halo pattern. In this case, for example, a nanocrystalline oxide semiconductor layer is measured with an electron beam having a beam diameter much smaller than the sputtered particle 1002, whereby a spot (bright spot) can be observed in the obtained nanobeam electron diffraction pattern.

Note that the deposition surface 1003 preferably has an insulating property. With the deposition surface 1003 having an insulating property, the sputtered particles 1002 which are deposited on the deposition surface 1003 are less likely to lose positive charges. However, in the case where the deposition rate of the sputtered particles 1002 is less than the rate at which a positive charge is lost, the deposition surface 1003 may have conductivity. Note that the deposition surface 1003 is preferably an amorphous surface or an amorphous insulating surface.

FIG. 6A illustrates a crystal structure of an In—Ga—Zn oxide viewed from a direction parallel to an a-b plane of the crystal. FIG. 6B illustrates the crystal structure after ion collision during sputtering.

For example, cleavage of the crystal included in the In—Ga—Zn oxide occurs between a layer including a gallium atom and/or zinc atom and an oxygen atom and a layer including, a gallium atom and/or zinc atom and an oxygen atom, which are illustrated in FIG. 6B. This is because oxygen atoms which have negative charges exist in the layer in a close distance from each other. In this manner, the cleavage plane is parallel to the a-b plane.

That is, when an ion collides with the surface of a sputtering target including, a crystal grain of an In—Ga—Zn oxide, the crystal included in the In—Ga—Zn oxide is cleaved along a plane parallel to the a-b plane of the crystal, and flat plate-like sputtered particles whose top and bottom surfaces are parallel to the a-b plane are separated from the sputtering target.

Moreover, in the crystal of the In—Ga—Zn oxide illustrated in FIGS. 6A and 6B, metal atoms are arranged in a regular triangular or regular hexagonal configuration when seen from the direction perpendicular to the a-b plane: therefore, the flat plate-like crystal grain is likely to have the shape of a hexagonal cylinder whose regular hexagonal plane has internal angles of 120°.

<Method for Manufacturing Sputtering Target>

A method for manufacturing the above sputtering target s described with reference to FIGS. 7A and 7B.

In FIG. 7A, an oxide powder containing a plurality of metal elements which is used for the sputtering target is manufactured. First, the oxide powder is weighed in a step S101.

Here, description is given on the case where an oxide powder containing In, M, and Zn (also referred to as an In-M-Zn oxide powder) is obtained as the oxide powder containing a plurality of metal elements. Specifically, an $InO_X$ oxide powder, an $MO_Y$ oxide powder, and a $ZnO_Z$ oxide powder are prepared as a raw material. Note that X, Y, and Z are each a given positive number; for example, X, Y, and Z are 1.5, 1.5, and 1, respectively. It is needless to say that the above oxide powders are examples, and oxide powders can be selected as appropriate in order to obtain a desired composition. Note that M refers to Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

Next, the $InO_X$ oxide powder, the $MO_Y$ oxide powder, and the $ZnO_Z$ oxide powder are mixed in a predetermined molar ratio.

For example, the predetermined molar ratio of the $InO_X$ oxide powder, the $MO_Y$ oxide powder, and the $ZnO_Z$ oxide powder is 2:2:1, 8:4:3, 3:1:1, 1:1:1, 4:2:3, 1:1:2, 3:1:4, or 3:1:2. With such a molar ratio, a sputtering target including a polycrystalline oxide with high crystallinity can be obtained easily later.

Next, in a step S102, an In-M-Zn oxide is obtained by performing first baking on the $InO_X$ oxide powder, the $MO_Y$ oxide powder, and the $ZnO_Z$ oxide powder which are mixed in a predetermined molar ratio.

Note that the first baking is performed in an inert atmosphere, an oxidation atmosphere, or under a reduced pressure at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, further preferably longer than or equal to 30 minutes and shorter than or equal to 5 hours, for example. When the first baking is performed under the above conditions, secondary reactions other than the main reaction can be suppressed, and the impurity concentration in the In-M-Zn oxide powder can be reduced. Accordingly, the crystallinity of the In-M-Zn oxide powder can be increased.

The first baking may be performed plural times at different temperatures and/or in different atmospheres. For example, the In-M-Zn oxide powder may be first held at a first temperature in a first atmosphere and then at a second temperature in a second atmosphere. Specifically, it is preferable that the first atmosphere be an inert atmosphere or under a reduced pressure and the second atmosphere be an oxidation atmosphere. This is because an oxygen vacancy is generated in some cases in the In-M-Zn oxide when impurities contained in the In-M-Zn oxide powder are reduced in the first atmosphere. Therefore, it is preferable that oxygen vacancies in the obtained In-M-Zn oxide be reduced in the second atmosphere. The impurity concentration and oxygen vacancies in the In-M-Zn oxide are reduced, whereby the crystallinity of the In-M-Zn oxide powder can be increased.

Next, the In-M-Zn oxide powder is obtained by grinding the In-M-Zn oxide in a step S103.

The In-M-Zn oxide has a high proportion of crystals with surface strictures of planes parallel to the a-b plane. Therefore, the obtained In-M-Zn oxide powder includes many flat plate-like crystal gains whose top and bottom surfaces are parallel to the a-b plane. Moreover, the crystal of the In-M-Zn oxide has, in many cases, a hexagonal or trigonal (rhombohedral) crystal structure; therefore, in many cases, the above flat plate-like crystal gains each have the shape of a hexagonal cylinder whose top and bottom surfaces are approximately equilateral hexagons each having interior angles of 120°.

Next, the gain size of the obtained In-M-Zn oxide powder is checked in a step S104. Here, the average grain size of the In-M-Zn oxide powder is checked to be less than or equal to 3 µm, preferably less than or equal to 2.5 µm, further preferably less than or equal to 2 µm. Note that the step S104 may be omitted and only the In-M-Zn oxide powder whose gain size is less than or equal to 3 µm, preferably less than or equal to 2.5 µm, further preferably less than or equal to 2 µm may be sifted using a gain size filter. The average grain size of the In-M-Zn oxide powder can be certainly less than or equal to 3 µm, preferably less than or equal to 2.5 µm, further preferably less than or equal to 2 µm by sifting the In-M-Zn oxide powder whose gain size is less than or equal to 3 µm, preferably less than or equal to 2.5 µm, further preferably less than or equal to 2 µm.

In the case where the average pain size of the In-M-Zn oxide powder exceeds a predetermined size in the step S104, the procedure returns to the step S103 and the In-M-Zn oxide powder is ground again.

In the above manner, the In-M-Zn oxide powder whose average pain size is less than or equal to 3 µm, preferably less than or equal to 2.5 µm, further preferably less than or equal to 2 µm can be obtained. Note that the gain size of a crystal gain included in a sputtering target to be manufactured later can be reduced by obtaining the In-M-Zn oxide powder whose average gain size is less than or equal to 3 µm preferably less than or equal to 2.5 µm, further preferably less than or equal to 2 µm.

Next, in FIG. 7B, a sputtering target is manufactured using the In-M-Zn oxide powder obtained in the flow chart shown in FIG. 7A.

In a step S111, the In-M-Zn oxide powder is made to spread over a mold and molded. Here, molding refers to making powder or the like spread over a mold to obtain a uniform thickness. Specifically, the In-M-Zn oxide powder is introduced into the mold, and then vibration is externally applied so that the In-M-Zn oxide powder is molded. Alternatively the In-M-Zn oxide powder is introduced into the mold, and then molding is performed using a roller or the like so as to obtain a uniform thickness. Note that in the step S111, slurry in which the In-M-Zn oxide powder is mixed with water, a dispersant, and a binder may be molded. In that case, the slurry is poured into the mold and then molded by sucking the mold from the bottom. After that, drying treatment is performed on a molded body after the mold is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal gains whose top and bottom surfaces are parallel to the a-b plane is made to spread over the mold and molded, the crystal gains are arranged with the planes which are parallel to the a-b plane thereof facing upward. Therefore, the proportion of the surface structures of planes parallel to the a-b plane can be increased in such a manner that the obtained In-M-Zn oxide powder is made to spread over the mold and molded. Note that the mold may be formed of a metal or an oxide and the upper shape thereof is rectangular or rounded.

Next, in a step S112, second baking is performed on the In-M-Zn oxide powder. Then, first pressure treatment is performed on the In-M-Zn oxide powder winch has been subjected to the second baking, whereby plate-like In-M-Zn oxide is obtained in a step S113. The second baking is performed under conditions similar to those of the first baking. The crystallinity of the In-M-Zn oxide can be increased by performing the second baking.

Note that the first pressure treatment may be performed in any manner as long as the In-M-Zn oxide powder can be pressed. For example, a weight which is formed of the same kind of material as the mold can be used. Alternatively, the In-M-Zn oxide powder may be pressed under a high pressure using compressed air. Besides, the first pressure treatment can be performed using various known techniques. Note that the first pressure treatment may be performed at the same time as the second baking.

Planarization treatment may be performed after the first pressure treatment. As the planarization treatment, chemical mechanical polishing (CMP) treatment or the like can be employed.

The plate-like In-M-Zn oxide thus obtained becomes a polycrystalline oxide with high crystallinity.

Next, the thickness of the obtained plate-like In-M-Zn oxide is checked in a step S114. When the thickness of the plate-like In-M-Zn oxide is less than a desired thickness, the procedure returns to the step S111 and the oxide powder is made to spread over the plate-like In-M-Zn oxide and molded. When the plate-like In-M-Zn oxide has a desired thickness, the plate-like In-M-Zn oxide is used as a sputtering target. The description of the case where the thickness of the plate-like In-M-Zn oxide is less than a desired thickness is given below.

Next, in the step S112, third baking is performed on the plate-like In-M-Zn oxide and the In-M-Zn oxide powder over the plate-like In-M-Zn oxide. Then, in the step S113, second pressure treatment is performed on the plate-like In-M-Zn oxide and the In-M-Zn oxide powder over the plate-like In-M-Zn oxide which have been subjected to the third baking, whereby a plate-like In-M-Zn oxide whose thickness is increased by the thickness of the In-M-Zn oxide powder is obtained. A plate-like In-M-Zn oxide with an increased thickness is obtained through crystal growth with the use of the plate-like In-M-Zn oxide as a seed crystal; therefore, the plate-like In-M-Zn oxide is a polycrystalline oxide with high crystallinity.

Note that the third baking is performed under conditions similar to those of the second baking. The second pressure treatment is performed under conditions similar to those of the first pressure treatment. Note that the second pressure treatment may be performed at the same time as the third baking.

The thickness of the obtained plate-like In-M-Zn oxide is checked again in the step S114.

Through the above steps, the thickness of the plate-like In-M-Zn oxide can be gradually increased while the crystal alignment is improved.

By repeating these steps of increasing the thickness of a plate-like In-M-Zn oxide n times (n is a natural number), the plate-like In-M-Zn oxide having a desired thickness (t), for example, greater than or equal to 2 mm and less than or equal to 20 mm, preferably greater than or equal to 3 mm and less than or equal to 20 mm can be obtained. The plate-like In-M-Zn oxide is used as a sputtering target.

After that, planarization treatment may be performed.

Note that fourth baking may be performed on the obtained sputtering target. The fourth baking is performed under conditions similar to those of the first baking. A sputtering target including a polycrystalline oxide with much higher crystallinity can be obtained by performing the fourth baking.

In the above manner, the sputtering target which includes a polycrystalline In—Zn oxide containing a plurality of crystal gains having cleavage planes parallel to the a-b plane and a small average grain size can be manufactured.

Note that the sputtering target formed in such a manner can have high density. When the density of the sputtering target is increased, the density of a film to be formed can also be increased. Specifically, the relative density of the sputtering target can be set to 90% or higher, preferably 95% or higher, thither preferably 99% or higher.

The methods and structures described in this embodiment can be combined as appropriate with any of the methods and structures described in the other embodiments.

Embodiment 3

In this embodiment, another example of the stacked-layer structure of the semiconductor device of one embodiment of the present invention will be described with reference to FIGS. 8A and 8B. Specifically, in this embodiment, the case in which the oxide semiconductor layer described in Embodiment 1 has a stacked-layer structure of a first oxide semiconductor layer including a nanocrystal a second oxide semiconductor layer including a CAAC-OS, and a third oxide semiconductor layer including a nanocrystal is given as an example.

Figure 8A:
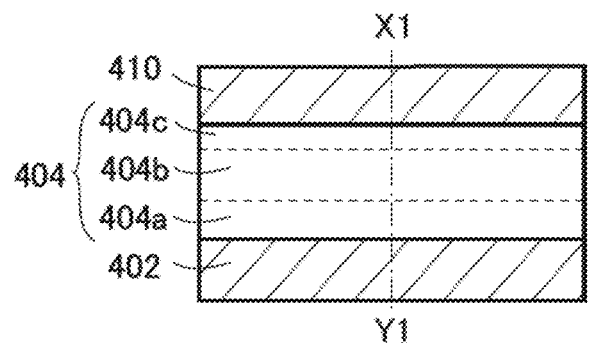
FIGS. 8A and 8B are a schematic view exemplifying a stacked-layer structure of a semiconductor device of one embodiment of the present invention and a band structure thereof.
Figure 8B:
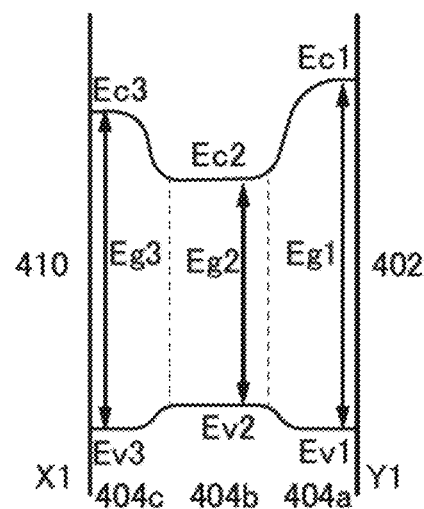

FIG. 8A is a cross-sectional view of oxide semiconductor layers between insulating layers. FIG. 8B shows a band structure along line X1-Y1 in FIG. 8A.

The stacked-layer structure of this embodiment includes an oxide semiconductor layer 404 between an insulating layer 402 and an insulating layer 410, and the oxide semiconductor layer 404 includes a first oxide semiconductor layer 404$a$, a second oxide semiconductor layer 404$b$, and a third oxide semiconductor layer 404$c$.

As the second oxide semiconductor layer 404$b$ included in the oxide semiconductor layer 404, an oxide semiconductor layer including a CAAC-OS is used. Further, as the second oxide semiconductor layer 404$b$, an oxide semiconductor layer having higher electron affinity than the first oxide semiconductor layer 404$a$ and the third oxide semiconductor layer 404$c$ is used. For example, as the second oxide semiconductor layer 404$b$, an oxide semiconductor layer having higher electron affinity than the first oxide semiconductor layer 404$a$ and the third oxide semiconductor layer 404$c$ by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used.

Note that the electron affinity refers to an energy difference between the vacuum level and the conduction band minimum. In FIG. 8B, the conduction band minimum energy of the first oxide semiconductor layer 404$a$, that of the second oxide semiconductor layer 404$b$, and that of the third oxide semiconductor layer 404$c$ are denoted by Ec1, Ec2, and Ec3, respectively. The valence band maximum energy of the first oxide semiconductor layer 404$a$, that of the second oxide semiconductor layer 404$b$, and that of the third oxide semiconductor layer 404$c$ are denoted by Ev1, Ev2, and Ev3, respectively.

At least as one of the first oxide semiconductor layer 404$a$ and the third oxide semiconductor layer 404$c$ included in the oxide semiconductor layer 404, an oxide semiconductor layer including a nanocrystal is used. In this embodiment, an oxide semiconductor layer including a nanocrystal is used as both of the first oxide semiconductor layer 404$a$ and the third oxide semiconductor layer 404$c$.

Moreover, for the first oxide semiconductor layer 404$a$ and the third oxide semiconductor layer 404$c$, an oxide semiconductor layer whose energy gap is larger than an energy gap Eg2 of the second oxide semiconductor layer 404$b$ is used. For example, an energy gap Eg1 of the first oxide semiconductor layer 404$a$ and an energy gap Eg3 of the third oxide semiconductor layer 404$c$ are greater than or equal to 2.7 eV and less than or equal to 4.9 eV preferably greater than or equal to 3 eV and less than or equal to 4.7 eV, further preferably greater than or equal to 3.2 eV and less than or equal to 4.4 eV. Note that the energy gap Eg2 of the second oxide semiconductor layer 404b is smaller than the energy gaps Eg1 and Eg3, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

When an electric field is applied to a gate electrode layer in such a structure, the second oxide semiconductor layer 404b of the oxide semiconductor layer 404 whose conduction band minimum energy is the lowest serves as a main current path. In other words, the first oxide semiconductor layer 404a is formed between the second oxide semiconductor layer 404b and the insulating layer 402 and the third oxide semiconductor layer 404c is formed between the second oxide semiconductor layer 404b and the insulating layer 410, whereby a structure in which a channel of a transistor is not in contact with a gate insulating layer can be obtained.

The second oxide semiconductor layer 404b has higher film density and a lower defect state density than the first oxide semiconductor layer 404a and the third oxide semiconductor layer 404c. Thus, it is possible to suppress a change in electrical characteristics of the transistor due to defect states by formation of a channel in the second oxide semiconductor layer 404b; accordingly, a highly reliable transistor can be obtained.

Further, an oxide semiconductor layer with low carrier density is used as the second oxide semiconductor layer 404b. For example, an oxide semiconductor layer whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$ is used as the second oxide semiconductor layer 404b.

The second oxide semiconductor layer 404b contains at least indium. The second oxide semiconductor layer 404b preferably contains at least indium in order that the carrier mobility (electron mobility) is high. In addition to indium, an element M (aluminum, gallium, yttrium, zirconium, or tin) is preferably contained.

The first oxide semiconductor layer 404a contains one or more kinds of elements contained in the second oxide semiconductor layer 404b. Further, since the first oxide semiconductor layer 404a contains one or more kinds of elements contained in the second oxide semiconductor layer 404b, interface scattering is less likely to occur at the interface between the second oxide semiconductor layer 404b and the first oxide semiconductor layer 404a. Thus, the transistor can have a high field-effect mobility because the movement of carriers is not hindered at the interface.

The first oxide semiconductor layer 404a may contain a larger amount of, for example, aluminum, titanium, silicon, gallium, germanium, yttrium, zirconium, tin, lanthanum, cerium, or hafnium in an atomic ratio than that of indium in an atomic ratio. Specifically, the amount of any of the above elements in the first oxide semiconductor layer 404a in an atomic ratio is 1.5 times or more, preferably 2 times or more, further preferably 3 times or more as large as that of indium in an atomic ratio. The above elements increase the energy gap of the oxide semiconductor layer in some cases. When a large amount of any of the above elements in an atomic ratio is contained in the oxide semiconductor layer, it decreases the electron affinity of the oxide semiconductor layer in some cases. Any of the above elements is more strongly bonded to oxygen than indium is, and thus has a function of suppressing generation of an oxygen vacancy in the oxide semiconductor layer. The above elements block an impurity of the oxide semiconductor layer or reduce the diffusion coefficient of an impurity in some cases. Further, the first oxide semiconductor layer 404a contains a larger amount of any of the above elements in an atomic ratio than that in the second oxide semiconductor layer 404b in an atomic ratio.

The third oxide semiconductor layer 404c contains one or more kinds of elements contained in the second oxide semiconductor layer 404b. Further, since the third oxide semiconductor layer 404c contains one or more kinds of elements contained in the second oxide semiconductor layer 404b, interface scattering is less likely to occur at the interface between the second oxide semiconductor layer 404b and the third oxide semiconductor layer 404c. Thus, the transistor can have a high field-effect mobility because the movement of carriers is not hindered at the interface.

The third oxide semiconductor layer 404c may contain a larger amount of, for example, aluminum, titanium silicon, gallium, germanium, yttrium, zirconium, tin, lanthanum, cerium, or hafnium in an atomic ratio than that of indium in an atomic ratio. Specifically, the amount of any of the above elements in the third oxide semiconductor layer 404c in an atomic ratio is 1.5 times or more, preferably 2 times or more, further preferably 3 times or more as large as that of indium in an atomic ratio. Note that the third oxide semiconductor layer 404c contains any of the above elements in a higher atomic ratio than the second oxide semiconductor layer 404b.

Note that the first oxide semiconductor layer 404a and the third oxide semiconductor layer 404c may have different physical properties or the same physical properties.

In the case of using an In-M-Zn oxide for the first oxide semiconductor layer 404a, when Zn and oxygen are eliminated from consideration, the proportion of In and the proportion of M are preferably less than 50 atomic % and greaten than or equal to 50 atomic %, respectively, further preferably less than 25 atomic % and greater than or equal to 75 atomic % respectively. In the case of using an In-M-Zn oxide for the second oxide semiconductor layer 404b, when Zn and oxygen are eliminated from consideration, the proportion of In and the proportion of M are preferably greater than or equal to 25 atomic % and less than 75 atomic %, respectively, further preferably greater than or equal to 34 atomic % and less than 66 atomic %, respectively. In the case of using an In-M-Zn oxide for the third oxide semiconductor layer 404c, when Zn and oxygen are eliminated from consideration, the proportion of In and the proportion of M are preferably less than 50 atomic % and greater than or equal to 50 atomic %, respectively, further preferably less than 25 atomic % and greater than or equal to 75 atomic %, respectively.

The thickness of the first oxide semiconductor layer 404a is greater than or equal to 5 nm and less than or equal to 100 nm, preferably greater than or equal to 5 nm and less than or equal to 50 nm. The thickness of the second oxide semiconductor layer 404b is greater than or equal to 5 nm and less than or equal to 200 nm, preferably greater than or equal to 5 nm and less than or equal to 100 nm, further preferably greater than or equal to 5 nm and less than or equal to 50 nm. The thickness of the third oxide semiconductor layer 404c is greater than or equal to 5 nm and less than or equal to 100 nm, preferably greater than or equal to 5 nm and less than or equal to 50 nm.

Since each of the first oxide semiconductor layer 404a and the third oxide semiconductor layer 404c contains one or more kinds of metal elements contained in the second oxide semiconductor layer 404b, the oxide semiconductor layer 404 can also be referred to as an oxide stack in which layers containing the same main components are stacked. The oxide stack in which layers containing the same main components are stacked is formed to have not only a simple stacked-layer structure of the layers but also a continuous energy band (here, in particular, a well structure having a U shape in which the conduction band minimum energies are changed continuously between the layers). This is because when an impurity which forms a defect state such as a trapping center or a recombination center is mixed at an interface between the layers, the continuity of the energy band is lost, and thus carriers are trapped or disappear by recombination at the interface.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump so that water and the like acting as impurities of the oxide semiconductor are removed as much as possible. Alternatively, a combination of a turbo molecular pump and a cold trap is preferably used to prevent back-flow of a gas from an exhaust system into the chamber.

Not only high vacuum evacuation of the chamber but also high purification of a sputtering gas is necessary to reduce hydrogen and oxygen vacancies that cause defect states in the oxide semiconductor layer and obtain a highly purified intrinsic oxide semiconductor layer. As an oxygen gas or an argon gas used as the sputtering gas, a gas that is highly purified to have a dew point of $-40°$ C. or lower, preferably $-80°$ C. or lower, further preferably $-100°$ C. or lower is used, so that entry of moisture or the like into the oxide semiconductor can be prevented as much as possible.

Each of the first oxide semiconductor layer 404a and the third oxide semiconductor layer 404c which are provided over and under the second oxide semiconductor layer 404b can serve as a barrier layer, and suppress the adverse effect of a defect state which is formed at the interface between the oxide semiconductor layer 404 and each of the insulating layers in contact with the oxide semiconductor layer 404 on the second oxide semiconductor layer 404b which serves as a main carrier path for the transistor.

For example, oxygen vacancies in the oxide semiconductor layer appear as localized states in deep energy area in the energy gap of the oxide semiconductor. A carrier is trapped in such localized states, so that the reliability of the transistor is reduced. For this reason, oxygen vacancies in the oxide semiconductor layer need to be reduced. The oxide semiconductor layers whose compositions are less likely to cause an oxygen vacancy than the composition of the second oxide semiconductor layer 404b are provided over and under and in contact with the second oxide semiconductor layer 404b in the oxide semiconductor layer 404, whereby oxygen vacancies in the second oxide semiconductor layer 404b can be reduced.

In addition, when the second oxide semiconductor layer 404b is in contact with an insulating layer including a different constituent element (e.g., a base insulating layer including a silicon oxide film), an interface state is sometimes formed at the interface of the two layers and the interface state forms a channel. At this time, in some cases, a second transistor having a different threshold voltage is formed and accordingly an apparent threshold voltage of the transistor is fluctuated. However, since the first oxide semiconductor layer 404a contains one or more kinds of metal elements contained in the second oxide semiconductor layer 404b in the oxide semiconductor layer 404, an interface state is less likely to be formed at the interface between the first oxide semiconductor layer 404a and the second oxide semiconductor layer 404b. Thus, with the first oxide semiconductor layer 404a, variations in electrical characteristics of the transistors, such as a threshold voltage, can be reduced.

In the case where a channel is formed at the interface between a gate insulating layer (here, assumed to be the insulating layer 410) and the second oxide semiconductor layer 404b, interface scattering occurs at the interface and the field-effect mobility of the transistor is decreased. However, since the third oxide semiconductor layer 404c contains one or more kinds of metal elements contained in the second oxide semiconductor layer 404b in the oxide semiconductor layer 404, scattering of carriers is less likely to occur at the interface between the second oxide semiconductor layer 404b and the third oxide semiconductor layer 404c, and thus the field-effect mobility of the transistor can be increased.

Further, each of the first oxide semiconductor layer 404a and the third oxide semiconductor layer 404c also serves as a barrier layer which suppresses formation of impurity levels due to the entry of the constituent elements of the insulating layers which are in contact with the oxide semiconductor layer 404 into the second oxide semiconductor layer 404b.

For example, in the case of using a silicon-containing insulating layer as each of the insulating, layers 402 and 410 which are in contact with the oxide semiconductor layer 404, the silicon in the insulating layers or carbon which might be contained in the insulating layers in some cases enters the first oxide semiconductor layer 404a or the third oxide semiconductor layer 404c at a depth of several nanometers from the interface. An impurity such as silicon or carbon entering the oxide semiconductor layer forms impurity levels. The impurity levels serve as a donor and generates an electron, so that an n-type region is sometimes formed in the oxide semiconductor layer.

However, when the thicknesses of the first oxide semiconductor layer 404a and the third oxide semiconductor layer 404c are larger than several nanometers, the impurity such as silicon or carbon which has entered the oxide semiconductor layer does not reach the second oxide semiconductor layer 404b, so that the influence of impurity levels is suppressed.

Here, the concentration of silicon contained in the oxide semiconductor layer is lower than or equal to $3\times10^{18}/cm^3$, preferably lower than or equal to $3\times10^{17}/cm^3$. In addition, the concentration of carbon contained in the oxide semiconductor layer is lower than or equal to $3\times10^{18}/cm^3$, preferably lower than or equal to $3\times10^{17}/cm^3$. It is particularly preferable to sandwich or surround the second oxide semiconductor layer 404b which serves as a carrier path by the first oxide semiconductor layer 404a and the third oxide semiconductor layer 404c in order to prevent entry of much silicon or carbon which is a Group 14 element into the second oxide semiconductor layer 404b. That is, the concentrations of silicon and carbon contained in the second oxide semiconductor layer 404b are preferably lower than those in the first oxide semiconductor layer 404a and the third oxide semiconductor layer 404c.

Note that the impurity concentration in the oxide semiconductor layer can be measured by secondary ion mass spectrometry (SIMS).

If hydrogen or moisture is contained in the oxide semiconductor layer as an impurity it can work as a donor and form an n-type region; therefore, in order to achieve a well-shaped structure, it is useful to provide a protective insulating layer (e.g., a silicon nitride layer) for preventing entry of hydrogen or moisture from the outside into the upper portion of the oxide semiconductor layer 404.

The methods and structures described in this embodiment can be combined as appropriate with any of the methods and structures described in the other embodiments.

Embodiment 4

In this embodiment, a structure example of a transistor including the oxide semiconductor layer described in Embodiment 1 or 3 will be described with reference to drawings.

<<Structure Example of Transistor>>

Figure 9A:
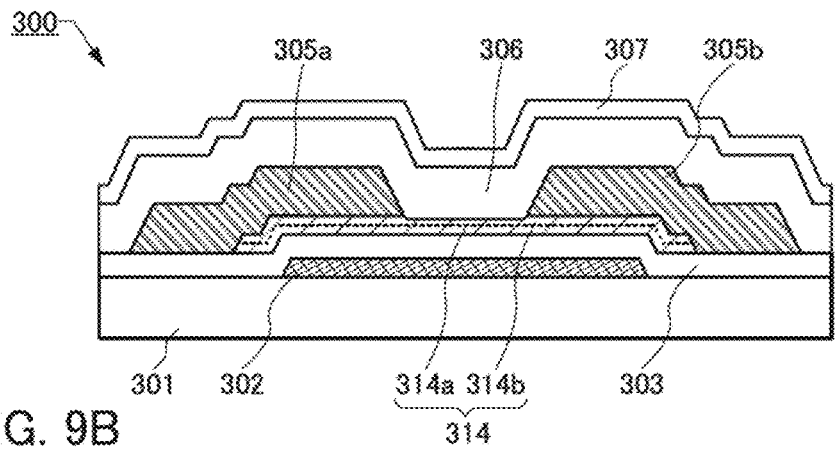
FIGS. 9A to 9C each illustrate a structure example of a transistor of one embodiment.

FIG. 9A is a schematic cross-sectional view of a transistor 300. The transistor 300 exemplified by this structure example is a bottom-gate transistor.

The transistor 300 includes a gate electrode layer 302 provided over a substrate 301, an insulating layer 303 provided over the substrate 301 and the gate electrode layer 302, an oxide semiconductor layer 314 provided over the insulating layer 303 to overlap with the gate electrode layer 302, and a source electrode layer 305a and a drain electrode layer 305b which are in contact with the top surface of the oxide semiconductor layer 314. Moreover, an insulating layer 306 covers the insulating layer 303 the oxide semiconductor layer 314, and the source electrode layer 305a and the drain electrode layer 305b; and an insulating layer 307 is provided over the insulating layer 306.

The oxide semiconductor layer 314 included in the transistor 300 has a stacked-layer structure of an oxide semiconductor layer 314a and an oxide semiconductor layer 314b. Note that a boundary between the oxide semiconductor layer 314a and the oxide semiconductor layer 314b is shown by broken lines in FIG. 9A and the like because the boundary is not clear in some cases.

Both the oxide semiconductor layer 314a and the oxide semiconductor layer 314b are crystalline oxide semiconductor layers, which have different crystallinity. In this embodiment, for the oxide semiconductor layer 314a, an oxide semiconductor layer having higher film quality and a lower defect state density than the oxide semiconductor layer 314b is used. Preferably, the oxide semiconductor layer 314a is a CAAC-OS film, and the oxide semiconductor layer 314b is a nanocrystalline oxide semiconductor layer. In other words, the oxide semiconductor layer 314 of the transistor 300 in this embodiment corresponds to the oxide semiconductor layer 114 described in Embodiment 1 with reference to FIG. 1B. The insulating layer 306 of the transistor 300 corresponds to the insulating layer 106 described in Embodiment 1 with reference to FIG. 1B.

Typical examples of a material of the oxide semiconductor layer 314a are In—Ga oxide, In—Zn oxide, and In-M-Zn oxide (M represents Al, Ti, Ga, Y, Zr, La, Ce, Nd, or Hf). In the case of using an In-M-Zn oxide for the oxide semiconductor layer 314a, when Zn and oxygen are eliminated from consideration, the proportion of In and the proportion of M are preferably greater than or equal to 25 atomic % and less than 75 atomic %, respectively, further preferably greater than or equal to 34 atomic % and less than 66 atomic %, respectively. In addition, the oxide semiconductor layer 314a is formed using a material having an energy gap of 2 eV or higher, preferably 2.5 eV or higher, further preferably 3 eV or higher, for example.

In this embodiment, the oxide semiconductor layer 314b is formed using an oxide semiconductor layer which contains one or more kinds of metal elements contained in the oxide semiconductor layer 314a. For example, an oxide semiconductor layer that is represented by an In-M-Zn oxide (M is a metal such as Al, Ti, Ga, Ge, Y, Zr, Sn, La, Ce, or Hf) and contains a larger amount of M in an atomic ratio than that in the oxide semiconductor layer 314a in an atomic ratio is used. Specifically, the amount of the element M in the oxide semiconductor layer 314b in an atomic ratio is 1.5 times or more, preferably 2 times or more, further preferably 3 times or more as large as that of the oxide semiconductor layer 314a in an atomic ratio. The element M is more strongly bonded to oxygen than indium is, and thus the oxide semiconductor layer 314b has a function of suppressing generation of an oxygen vacancy. Thus, an oxygen vacancy can be less likely to be caused in the oxide semiconductor layer 314b than in the oxide semiconductor layer 314a.

It is preferable to use, as the oxide semiconductor layer 314b, an oxide semiconductor which is an In-M-Zn oxide (M represents Al, Ti, Ga, Y, Zr, La, Ce, Nd, or Hf) and whose conduction band minimum is closer to a vacuum level than that of the oxide semiconductor used as the oxide semiconductor layer 314a. For example, the difference in the conduction band minimum energy between the oxide semiconductor layer 314b and the oxide semiconductor layer 314a is preferably 0.05 eV or more 0.07 eV or more, 0.1 eV or more, or 0.15 eV or more and 2 eV or less, 1 eV or less, 0.5 eV or less, or 0.4 eV or less.

For example, in the case of using an In-M-Zn oxide for the oxide semiconductor layer 314b, when Zn and oxygen are eliminated from consideration, the proportion of In and the proportion of M are preferably less than 50 atomic % and greaten than or equal to 50 atomic %, respectively, further preferably less than 25 atomic % and greater than or equal to 75 atomic % respectively.

For example, as the oxide semiconductor layer 314a, an In—Ga—Zn oxide in which an atomic ratio of In to Ga and Zn is 1:1:1 or 3:1:2 can be used. As the oxide semiconductor layer 314b, an In—Ga—Zn oxide in which an atomic ratio of In to Ga and Zn is 1:3:2, 1:6:4, or 1:9:6 can be used. Note that the atomic ratio of each of the oxide semiconductor layers 314a and 314b may vary within a margin of ±20% of the corresponding atomic ratio.

However, the compositions are not limited to those described above, and a material having the appropriate composition may be used depending on required semiconductor characteristics and electrical characteristics of the transistor (e.g., field-effect mobility and threshold voltage). Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layers 314a and 314b be set to appropriate values.

Although the oxide semiconductor layer 314 is a stack of two oxide semiconductor layers in the above structure, it may be a stack of three or more oxide semiconductor layers.

<<Substrate 301>>

There is no particular limitation on the property of a material and the like of the substrate 301 as long as the material has heat resistance enough to withstand at least heat treatment which will be performed later. For example, a glass substrate, a ceramic substrate, a quartz substrate, a sapphire substrate, or a yttria-stabilized zirconia (YSZ) substrate may be used as the substrate 301. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 301. Still alternatively, any of these substrates provided with a semiconductor element may be used as the substrate 301.

Still alternatively, a flexible substrate such as a plastic substrate may be used as the substrate 301, and the transistor 300 may be provided directly on the flexible substrate. Further alternatively, a separation layer may be provided between the substrate 301 and the transistor 300. The separation layer can be used when part or the whole of the transistor formed over the separation layer is formed and separated from the substrate 301 and transferred to another substrate. Thus, the transistor 300 can be transferred to a substrate having low heat resistance or a flexible substrate.

<<Gate Electrode Layer 302>>

The gate electrode layer 302 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Furthermore, the gate electrode layer 302 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode layer 302 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 302 and the insulating layer 303. These films each have a work function higher than or equal to 5 eV preferably higher than or equal to 5.5 eV which is higher than the electron affinity of an oxide semiconductor; thus, the threshold voltage of a transistor including an oxide semiconductor can shift in the positive direction. Accordingly, a switching element having what is called normally-off characteristics can be achieved. For example, in the case of using an In—Ga—Zn-based oxynitride semiconductor film, an In—Ga—Zn-based oxynitride semiconductor film having a higher nitrogen concentration than at least the oxide semiconductor layer 314, specifically, an In—Ga—Zn-based oxynitride semiconductor film having a nitrogen concentration of 7 atomic % or higher is used.

<<Insulating Layer 303>>

The insulating layer 303 functions as a gate insulating film. The insulating layer 303 in contact with the bottom surface of the oxide semiconductor layer 314 is preferably an amorphous film.

The insulating layer 303 may be formed to have a single-layer structure or a stacked-layer structure using, for example, one or more of a silicon oxide film a silicon oxynitride film a silicon nitride oxide film, a silicon nitride film, an aluminum oxide film a hafnium oxide film, a gallium oxide film, and a Ga—Zn-based metal oxide film.

Further, the insulating layer 303 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

<<Source Electrode Layer 305a and Drain Electrode Layer 305b>>

The source electrode layer 305a and the drain electrode layer 305b can be formed to have a single-layer structure or a stacked-layer structure using, as a conductive material, any of single metals such as aluminum, titanium, chromium, nickel, copper, yttrium, zirconium, molybdenum, silver, tantalum and tungsten, or an alloy containing any of these single metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

A material which is capable of removing oxygen from part of the oxide semiconductor layer 314 to generate an oxygen vacancy is preferably used for regions of the source electrode layer 305a and the drain electrode layer 305b which are in contact with at least the oxide semiconductor layer 314. The carrier concentrations of the regions of the oxide semiconductor layer 314 in which oxygen vacancies are generated are increased, so that the regions become n-type regions (n$^+$ layers). Accordingly, the regions can function as a source region and a drain region. Examples of the material which is capable of removing oxygen from the oxide semiconductor layer 314 to generate an oxygen vacancy include tungsten and titanium.

Further, the entire region overlapping with the source electrode layer 305a of the oxide semiconductor layer 314 and the entire region overlapping with the drain electrode layer 305b of the oxide semiconductor layer 314 may serve as the source region and the drain region, respectively, depending on a material for forming the oxide semiconductor layer 314 or the thickness thereof.

When the source region and the drain region are formed in the oxide semiconductor layer 314, contact resistance between the oxide semiconductor layer 314 and each of the source electrode layer 305a and the drain electrode layer 305b can be reduced. Accordingly the electrical characteristics of the transistor, such as the field-effect mobility and the threshold voltage, can be made favorable.

<<Insulating Layers 306 and 307>>

The insulating layer 306 is preferably formed using an oxide insulating film that contains oxygen at a higher proportion than oxygen in the stoichiometric composition. Part of oxygen is released by heating from the oxide insulating film that contains oxygen at a higher proportion than oxygen in the stoichiometric composition. The oxide insulating film that contains oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

As the insulating layer 306, an insulating layer such as a silicon oxide layer or a silicon oxynitride layer can be used.

Note that the insulating layer 306 also functions as a film which relieves damage to the oxide semiconductor layer 314 at the time of forming the insulating layer 307 later.

Moreover, an oxide film through which oxygen is permeated may be provided between the insulating layer 306 and the oxide semiconductor layer 314.

As the oxide film through which oxygen is permeated, an insulating layer such as a silicon oxide layer or a silicon oxynitride layer can be used. Note that in this specification a "silicon oxynitride film" refers to a film that includes more oxygen than nitrogen, and a "silicon nitride oxide film" refers to a film that includes more nitrogen than oxygen.

The insulating layer 307 can be formed using an insulating film having a blocking effect against oxygen, hydrogen, water, and the like. Providing the insulating layer 307 over the insulating layer 306 can prevent outward diffusion of oxygen from the oxide semiconductor layer 314 and entry of hydrogen, water, or the like into the oxide semiconductor layer 314 from the outside. Examples of the insulating film having a blocking effect against oxygen, hydrogen, water, and the like are insulating layers such as a silicon nitride layer, a silicon nitride oxide layer, an aluminum oxide layer, an aluminum oxynitride layer, a gallium oxide layer, a gallium oxynitride layer, an yttrium oxide layer, an yttrium oxynitride layer, a hafnium oxide layer, and a hafnium oxynitride layer.

Note that it is also possible to provide a channel protective film over a channel formation region of the oxide semiconductor layer 314. Channel protective films can also be provided between the source electrode layer 305a and the oxide semiconductor layer 314 and between the drain electrode layer 305b and the oxide semiconductor layer 314. A channel protective transistor is obtained in the case where such channel protective films are provided. As an example, a silicon oxide film or a silicon oxynitride film can be used as a channel protective film. In the case of forming a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

<Modification Example of Transistor 300>

Examples of the structure of a transistor that is partly different from the transistor 300 is described below.

Modification Example 1

Figure 9B:
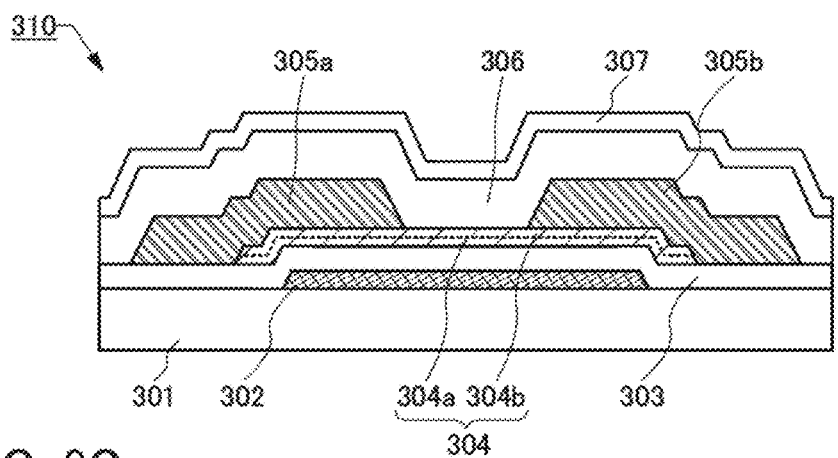

FIG. 9B is a schematic cross-sectional view of a transistor 310. The transistor 310 differs from the transistor 300 in the structure of the oxide semiconductor layer.

In the transistor 310, an oxide semiconductor layer 304 includes an oxide semiconductor layer 304a and an oxide semiconductor layer 304b. An oxide semiconductor layer including a nanocrystal is used as the oxide semiconductor layer 304a. An oxide semiconductor layer having higher film quality and a lower defect state density than the oxide semiconductor layer 304a is used as the oxide semiconductor layer 304b. Preferably a CAAC-OS film is used for the oxide semiconductor layer 304b. In other words, the oxide semiconductor layer 304 of the transistor 310 in this embodiment corresponds to the oxide semiconductor layer 104 described in Embodiment 1 with reference to FIG. 1A. The insulating layer 303 of the transistor 310 corresponds to the insulating layer 102 described in Embodiment 1 with reference to FIG. 1A.

Note that the transistor 310 has the same structure as the transistor 300 except the structure of the oxide semiconductor layer 304; thus the description of the transistor 300 can be referred to.

Modification Example 2

Figure 9C:
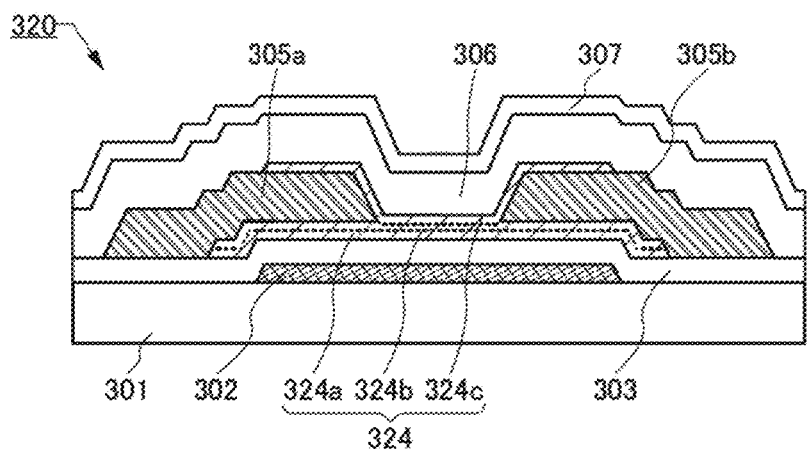

FIG. 9C is a schematic cross-sectional view of a transistor 320. The transistor 320 differs from the transistor 300 and the transistor 310 in the structure of the oxide semiconductor layer.

In an oxide semiconductor layer 324 included in the transistor 320, an oxide semiconductor layer 324a, an oxide semiconductor layer 324b, and an oxide semiconductor layer 324c are stacked in this order.

The oxide semiconductor layer 324a and the oxide semiconductor layer 324b are staged over the insulating layer 303. The oxide semiconductor layer 324c is provided in contact with a top surface of the oxide semiconductor layer 324b and top and side surfaces of the source electrode layer 305a and the drain electrode layer 305b.

An oxide semiconductor layer including a nanocrystal can be used as each of the oxide semiconductor layer 324a and the oxide semiconductor layer 324c. An oxide semiconductor layer having higher film quality and a lower defect state density than the oxide semiconductor layer 324a and the oxide semiconductor layer 324c is used as the oxide semiconductor layer 324b. Preferably, a CAAC-OS film is used for the oxide semiconductor layer 324b.

<Example of Method for Manufacturing Transistor>

Next, an example of a method for manufacturing the transistor 300 illustrated in FIG. 9A is described.

Figure 10A:
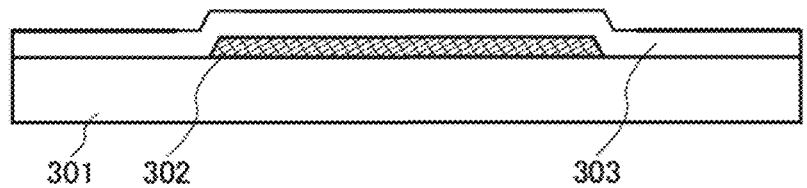
FIGS. 10A to 10D illustrate an example of a method for manufacturing a transistor of one embodiment.

First, as illustrated in FIG. 10A, the gate electrode layer 302 is formed over the substrate 301, and the insulating layer 303 is formed over the gate electrode layer 302.

Here, a glass substrate is used as the substrate 301.

<<Formation of Gate Electrode Layer>>

A formation method of the gate electrode layer 302 is described below. First, a conductive film is formed by a sputtering method, a CVD method, an evaporation method, or the like and then a resist mask is formed over the conductive film using a first photomask by a photolithography process. Then, part of the conductive film is etched using the resist mask to form the gate electrode layer 302. After that, the resist mask is removed.

Note that instead of the above formation method, the gate electrode layer 302 may be formed by an electrolytic plating method, a printing method, an ink-jet method, or the like.

<<Formation of Gate Insulating Layer>>

The insulating layer 303 that functions as a gate insulating layer is formed by a sputtering method, a CVD method, an evaporation method, or the like.

In the case where the insulating layer 303 is formed using a silicon oxide film, a oxynitride film, or a silicon nitride oxide film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case of forming a silicon nitride film as the insulating layer 303, it is preferable to use a two-step formation method. First, a first silicon nitride film with few defects is formed by a plasma CVD method in which a mixed gas of silane, nitrogen, and ammonia is used as a source gas. Then, a second silicon nitride film in which the hydrogen concentration is low and hydrogen can be blocked is formed by switching, the source gas to a mixed gas of silane and nitrogen. With such a formation method, a silicon nitride film having few defects and a blocking property against hydrogen can be formed as the insulating layer 303.

Moreover, in the case of forming a gallium oxide film as the insulating layer 303, a metal organic chemical vapor deposition (MOCVD) method can be employed.

<<Formation of Oxide Semiconductor Layer>>

Figure 10B:
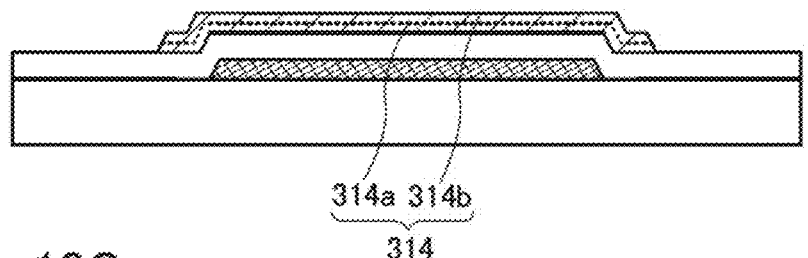

Next, as illustrated in FIG. 10B, the oxide semiconductor layer 304 is formed over the insulating layer 303.

The oxide semiconductor layer 314 can be formed in the manner described in Embodiment 2. In this embodiment, first, the oxide semiconductor layer 314a including a CAAC-OS is formed in the state where the substrate 301 is heated and then the oxide semiconductor layer 314b is formed in the state where the substrate temperature is room temperature. Then, a resist mask is formed over the oxide semiconductor layer 314b using a photomask by a photolithography process. Subsequently, the island-like oxide semiconductor layer 314 is formed using the resist mask. After that, the resist mask is removed.

When the oxide semiconductor layer 314a is formed, the temperature at which the substrate 301 is heated is preferably higher than or equal to 150° C. and lower than or equal to 450° C., further preferably higher than or equal to 200° C. and lower than or equal to 350° C. Note that to reduce the impurity concentration in the oxide semiconductor layer, it is effective to form the oxide semiconductor layer in the state where the substrate 301 is kept at high temperature.

Note that after the formation of the oxide semiconductor layer 314, heat treatment is preferably performed thereon in order to remove excess hydrogen (including water and a hydroxyl group) contained in the film (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen which is an impurity imparting n-type conductivity can be removed by the heat treatment.

Note that such heat treatment for dehydration or dehydrogenation may be performed at any timing in the process of manufacturing the transistor as long as the heat treatment is performed after the formation of the oxide semiconductor layer. The heat treatment for dehydration or dehydrogenation may be performed a plurality of times, and may also serve as another heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (i.e., the impurity concentration is preferably 1 ppm or lower, thither preferably 0.1 ppm or lower).

In addition, after the oxide semiconductor layer 314 is heated by the heat treatment, a high-purity oxygen gas, a high-purity dinitrogen monoxide gas, or ultra dry air (the moisture amount is less than or equal to 20 ppm (−55° C. by conversion into a dew point) preferably less than or equal to 1 ppm, further preferably less than or equal to 10 ppb, the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e. the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layer can have high purity and be an i-type (intrinsic) oxide semiconductor layer.

Note that not only high vacuum evacuation of the chamber but also high purification of a sputtering gas is necessary to obtain a highly purified intrinsic oxide semiconductor. As an oxygen gas or an argon gas used as the sputtering gas, a gas that is highly purified to have a dew point of −40° C. or lower, preferably −80° C. or lower, further preferably −100° C. or lower is used, so that entry of moisture or the like into the oxide semiconductor can be prevented as much as possible.

Since there is a possibility that oxygen which is a main component of an oxide semiconductor is also released and reduced by dehydration or dehydrogenation treatment, oxygen (including at least one of an oxygen radical, an oxygen atom, and an oxygen ion) may be introduced into the oxide semiconductor layer which has been subjected to the dehydration or dehydrogenation treatment to supply oxygen to the layer.

Introduction (supply) of oxygen into the dehydrated or dehydrogenated oxide semiconductor layer enables the oxide semiconductor layer to be highly purified and to be i-type (intrinsic). A change in electrical characteristics of a transistor including the highly-purified and i-type (intrinsic) oxide semiconductor is suppressed, and the transistor is electrically stable.

<Formation of Source Electrode Layer and Drain Electrode Layer>>

Figure 10C:
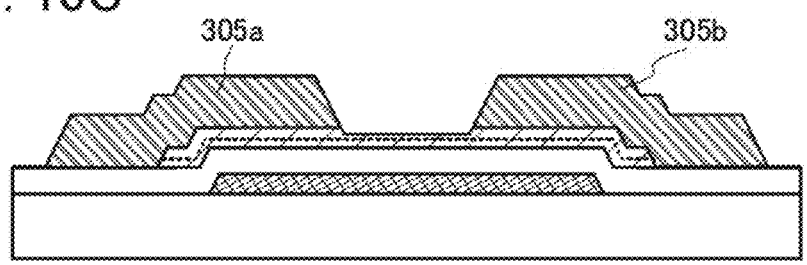

Next, as illustrated in FIG. 10C, the source electrode layer 305a and the drain electrode layer 305b are formed.

A formation method of the source electrode layer 305a and the drain electrode layer 305b is described below. First, a conductive film is formed by a sputtering method, a CVD method, an evaporation method, or the like. Then, a resist mask is formed over the conductive film using a third photomask by a photolithography process. Then, part of the conductive film is etched using the resist mask to form the source electrode layer 305a and the drain electrode layer 305b. After that, the resist mask is removed.

Note that as illustrated in FIG. 10C, the upper part of the oxide semiconductor layer 304 is partly etched and thinned by the etching of the conductive film in some cases.

<<Formation of Insulating Layer>>

Figure 10D:
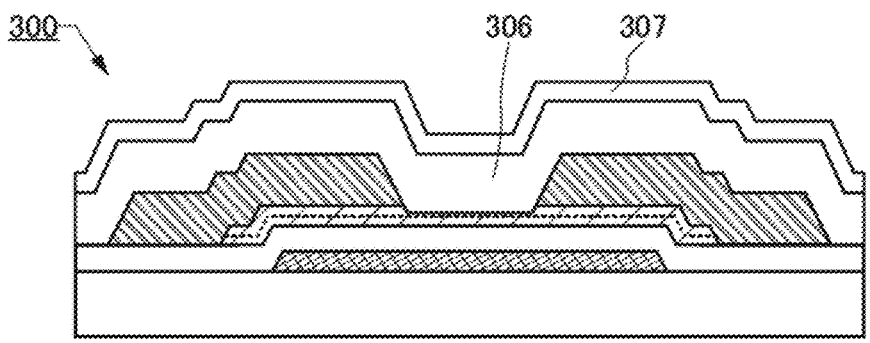

Next, as illustrated in FIG. 10D, the insulating layer 306 is formed over the oxide semiconductor layer 304, the source electrode layer 305a, and the drain electrode layer 305b, and the insulating layer 307 is successively formed over the insulating layer 306.

In the case of forming a silicon oxide film or a silicon oxynitride film as the insulating layer 306, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

For example, a silicon oxide film or a silicon oxynitride film can be formed under the following conditions: the substrate placed in a treatment chamber of a plasma CVD apparatus which is vacuum-evacuated is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of source gases into the treatment chamber, and a high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the degradation efficiency of the source gas in plasma is increased, oxygen radicals are increased, and oxidation of the source gas is promoted, therefore, the oxygen content of the oxide insulating film gets higher than that of the stoichiometric composition. However, the bonding strength of silicon and oxygen is weak in the above substrate temperature range, therefore, part of oxygen is released by heating. Thus, the oxide insulating film can be formed to be an oxide insulating film that contains oxygen at a higher proportion than oxygen in the stoichiometric composition and from which part of oxygen is released by heating.

In the case where an oxide insulating film is provided between the oxide semiconductor layer 304 and the insulating layer 306, the oxide insulating film functions as a protective film of the oxide semiconductor layer 304 in the steps of forming the insulating layer 306. Thus, the insulating layer 306 can be formed using the high-frequency power with high power density while damage to the oxide semiconductor layer 304 is reduced.

For example, as the oxide insulating film, a silicon oxide film or a silicon oxynitride film can be formed under the following conditions: the substrate placed in a treatment chamber of a plasma CVD apparatus which is vacuum-evacuated is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of source gases into the treatment chamber, and a high-frequency power is supplied to an electrode provided in the treatment chamber. Further, by setting the pressure in the treatment chamber to be greater than or equal to 100 Pa and less than or equal to 250 Pa, damage to the oxide semiconductor layer 304 can be reduced when the oxide insulating layer is formed.

A deposition gas containing silicon and an oxidizing gas are preferably used as a source gas of the oxide insulating film. Typical examples of the deposition gas containing silicon include slime, disilane, trisilane, and silane fluoride. As the oxidizing gas, oxygen, ozone, dinitrogen monoxide, and nitrogen dioxide can be given as examples.

The insulating, layer 307 can be formed by sputtering method, a CVD method, or the like.

In the case of forming a silicon nitride film or a silicon nitride oxide film as the insulating layer 307, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples. As the gas containing nitrogen, nitrogen and ammonia can be given as examples.

Through the above process, the transistor 300 can be formed.

<Another Structure Example of Transistor>

An example of the structure of a top-gate transistor to which the oxide semiconductor layer of one embodiment of the present invention can be applied will be described below.

Note that descriptions of components having structures or functions similar to those of the above, which are denoted by the same reference numerals, are omitted below.

Structure Example

Figure 11A:
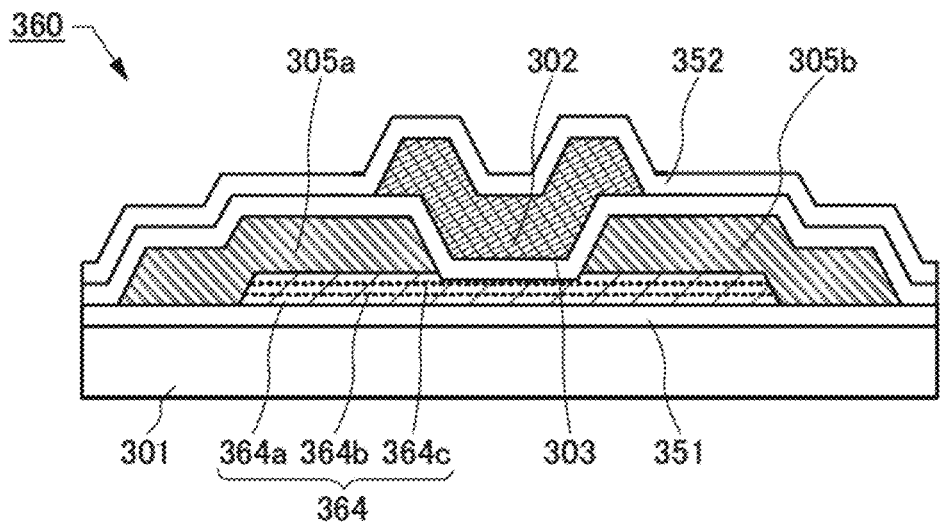
FIGS. 11A and 11B each illustrate a structure example of a transistor of one embodiment.

FIG. 11A is a schematic cross-sectional view of a top-gate transistor 360.

The transistor 360 includes an oxide semiconductor layer 364 provided over the substrate 301 provided with an insulating layer 351, the source electrode layer 305a and the drain electrode layer 305b which are in contact with the top surface of the oxide semiconductor layer 364, the insulating layer 303 provided over the oxide semiconductor layer 364, and the source electrode layer 305a and the drain electrode layer 305b, and the gate electrode layer 302 provided over the insulating layer 303 to overlap with the oxide semiconductor layer 364. Moreover, an insulating layer 352 covers the insulating layer 303 and the gate electrode layer 302.

The oxide semiconductor layer of one embodiment of the present invention can be used as the oxide semiconductor layer 364 of the transistor 360.

For example, the oxide semiconductor layer 364 includes an oxide semiconductor layer 364a, an oxide semiconductor layer 364b, and an oxide semiconductor layer 364c. Here, an oxide semiconductor layer including a nanocrystal is used as each of the oxide semiconductor layer 364a and the oxide semiconductor layer 364c. An oxide semiconductor layer having higher film quality and a lower defect state density than the oxide semiconductor layer 364a and the oxide semiconductor layer 364c is used as the oxide semiconductor layer 364b. Preferably, a CAAC-OS film is used for the oxide semiconductor layer 364b.

The insulating layer 351 has a function of suppressing diffusion of impurities from the substrate 301 to the oxide semiconductor layer 364. For example, a structure similar to that of the insulating layer 307 can be employed. Note that the insulating layer 351 is not necessarily provided when not needed.

The insulating layer 352 can be formed using an insulating film having a blocking effect against oxygen, hydrogen, water, and the like in a manner similar to that of the insulating layer 307. Note that the insulating layer 307 is not necessarily provided when not needed.

Modification Example

Structure examples of a transistor that is partly different from the transistor 360 is described below.

Figure 11B:
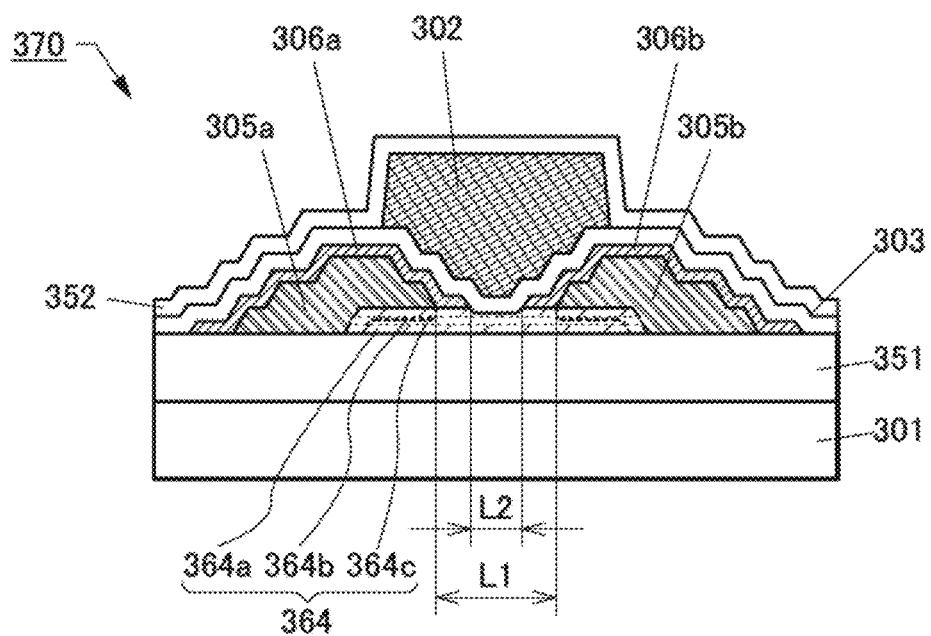

FIG. 11B is a schematic cross-sectional view of a transistor 370. The transistor 370 differs from the transistor 360 in the structure of a source electrode layer and a drain electrode layer. Specifically, the transistor 370 differs from the transistor 360 in that a source electrode layer 306a is formed over the source electrode layer 305a and a drain electrode layer 306b is formed over the drain electrode layer 305b.

As described above, in the case where a material with which an oxygen vacancy can be generated in the oxide semiconductor layer is used for the source electrode layer 305a and the drain electrode layer 305b, oxygen vacancies are generated in and around a region of the oxide semiconductor layer which is in contact with the source electrode layer 305a or the drain electrode layer 305b, so that the region becomes n-type and the n-type region can serve as a source or drain region of the transistor.

However, in the case of forming a transistor with an extremely short channel length, the n-type region which is formed by generation of the oxygen vacancies sometimes extends in the channel length direction of the transistor. In that case, the following phenomena and the like occur as for the electrical characteristics of the transistor: the threshold voltage is fluctuated; the source region and the drain region are brought into conduction so that on/off state of the transistor cannot be controlled. Accordingly, when a transistor with an extremely short channel length is formed, it is not preferable that the conductive material which is easily bonded to oxygen be used for a source electrode layer and a drain electrode layer.

For this reason, a distance between the source electrode layer 305a and the drain electrode layer 305b illustrated as L1 in FIG. 11B is set to 0.8 mm or more, preferably, 1.0 mm or more. When L1 is less than 0.8 μm, it is possible that an adverse effect of oxygen vacancies generated in the channel formation region cannot be eliminated and electrical characteristics of the transistor are degraded. Note that L1 can be regarded as the shortest distance between the end portion of the source electrode layer 305a and the end portion of the drain electrode layer 305b which are in contact with the oxide semiconductor layer 364 and face each other. Note that in FIG. 11B, the n-type region is illustrated schematically with a dotted line.

Thus, in the transistor 370, the source electrode layer 306a is formed in contact with the source electrode layer 305a and the oxide semiconductor layer 364, using a conductive material which is less likely to be bonded to oxygen. In addition, the drain electrode layer 306b is formed in contact with the drain electrode layer 305b and the oxide semiconductor layer 364, using a conductive material which is less likely to be bonded to oxygen.

The source electrode layer 306a extends in a direction of L1 beyond an end portion of the source electrode layer 305a in contact with the oxide semiconductor layer 364, and the drain electrode layer 306b extends in the direction of L1 beyond an end portion of the drain electrode layer 305b in contact with the oxide semiconductor layer 364.

The extended portion of the source electrode layer 306a and the extended portion of the drain electrode layer 306b are in contact with the oxide semiconductor layer 364 (in particular, the oxide semiconductor layer 364c). In the transistor 370 illustrated in FIG. 11B a distance between an end portion of the extended portion of the source electrode layer 306a, the end portion being in contact with the oxide semiconductor layer 364 and an end portion of the extended portion of the drain electrode layer 306b, the end portion being in contact with the oxide semiconductor layer 364 corresponds to the channel length. The channel length is shown as L2 in FIG. 11B.

As the conductive material which is less likely to be bonded to oxygen and is used to form the source electrode layer 306a and the drain electrode layer 306b, for example, a conductive nitride such as tantalum nitride or titanium nitride, or ruthenium is preferably used. Note that the conductive material which is less likely to be bonded to oxygen includes, in its category, a material to which oxygen is less likely to be diffused. The thickness of the conductive material is preferably greater than or equal to 5 nm and less than or equal to 500 nm, further preferably greater than or equal to 10 nm and less than or equal to 300 nm, still further preferably greater than or equal to 10 nm and less than or equal to 100 nm.

With the use of the above conductive material which is less likely to be bonded to oxygen for the source electrode layer 306a and the drain electrode layer 306b, generation of an oxygen vacancy in the channel formation region of the oxide semiconductor layer 364 can be suppressed, so that change of the channel formation region into an n-type can be suppressed. Accordingly, even a transistor with an extremely short channel length can have favorable electrical characteristics. That is, L2 can be made smaller than L1; for example even when L2 is 30 nm or shorter, favorable electrical characteristics of the transistor can be obtained. Further, in the case where the width of a single crystal region included in the oxide semiconductor layer 364 is 30 nm or more, the whole area of the channel formation region might be a single crystal oxide semiconductor layer in a cross section in the channel length direction.

Note that the conductive nitride such as tantalum nitride or titanium nitride might occlude hydrogen. Therefore, when conductive nitride is provided in contact with the oxide semiconductor layer 364, the hydrogen concentration in the oxide semiconductor layer 364 can be reduced.

Note that when a transistor with an extremely short channel length is formed, the source electrode layer 306a and the drain electrode layer 306b may be formed in such a manner that resist masks are processed by a method suitable for thin line processing, such as an electron beam exposure, and then etching treatment is performed. Note that with the use of a positive type resist for the resist masks, the exposed region can be minimized and throughput can be thus improved. In the above manner, a transistor with a channel length of 30 nm or less can be formed.

This embodiment can be combined as appropriate with any of the other embodiments disclosed in this specification.

Embodiment 5

Figure 12A:
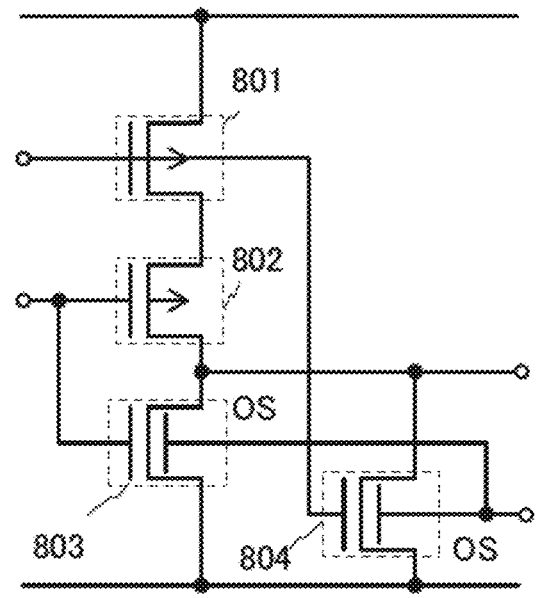
FIGS. 12A and 12B are circuit diagrams each illustrating a semiconductor device of one embodiment of the present invention.
Figure 12B:
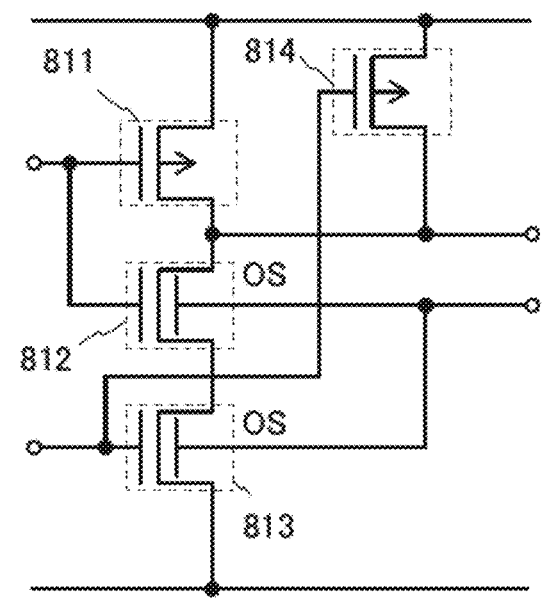

FIG. 12A illustrates an example of a circuit diagram of a NOR circuit, which is a logic circuit, as art example of the semiconductor device of one embodiment of the present invention. FIG. 12B is a circuit diagram of a NAND circuit.

In the NOR circuit in FIG. 12A, p-channel transistors 801 and 802 are transistors in each of which a channel formation region is formed using a semiconductor material (e.g., silicon) other than an oxide semiconductor, and n-channel transistors 803 and 804 each include an oxide semiconductor and each have a structure similar to any of the structures of the transistors described in Embodiment 4.

A transistor including a semiconductor material such as silicon can easily operate at high speed. In contrast, a charge can be held in a transistor including an oxide semiconductor for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be thrilled over the transistors 801 and 802 with an insulating layer provided therebetween.

In the NAND circuit in FIG. 12B, p-channel transistors 811 and 814 are transistors in each of which a channel formation region is formed using a semiconductor material (e.g., silicon) other than an oxide semiconductor, and n-channel transistors 812 and 813 each include an oxide semiconductor layer and each have a structure similar to any of the structures of the transistors described in Embodiment 4.

Note that in the NAND circuit in FIG. 12B, the transistors 812 and 813 have the structure similar to the transistor 360, and by controlling the potential of the second gate electrode, for example, by setting the potential to GND, the threshold voltages of the transistors 812 and 813 are increased, so that the transistors can be normally off.

As in the NOR circuit in FIG. 12A, to miniaturize the logic circuit, it is preferable that the n-channel transistors 812 and 813 be stacked over the p-channel transistors 811 and 812.

By applying, a transistor including an oxide semiconductor for a channel formation region and having an extremely low off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

In addition, by employing the structure of the transistor including the oxide semiconductor layer of one embodiment of the present invention, a NOR circuit and a NAND circuit with high reliability and stable characteristics can be provided.

Note that although the NOR circuit and the NAND circuit including the transistor described in Embodiment 3 are described as examples in this embodiment, one embodiment of the present invention is not particularly limited to the circuits, and an AND circuit, an OR circuit, or the like can be formed using the transistor described in Embodiment 3.

Alternatively, it is possible to fabricate a display device by combining a display element with any of the transistors described in this embodiment and the other embodiments. For example, a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Note that example of display devices including EL elements include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display) and the like. Examples of display devices including electronic ink or electrophoretic elements include electronic paper.

The methods and structures described in this embodiment can be combined as appropriate with any of the methods and structures described in the other embodiments.

Embodiment 6

In this embodiment, an example of a semiconductor device (memory device) which includes the transistor described in Embodiment 3, which can retain stored data even when not powered, and which has an unlimited number of write cycles will be described with reference to drawings.

Figure 13A:
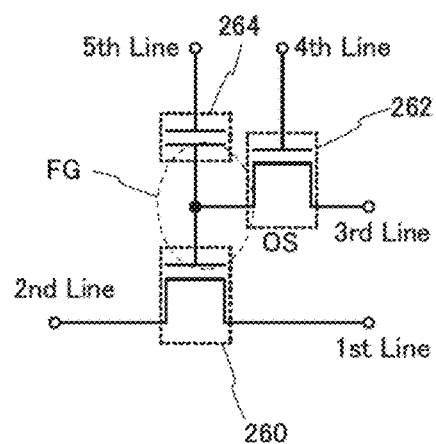
FIGS. 13A to 13C are circuit diagrams and a conceptual diagram of a semiconductor device of one embodiment of the present invention.

FIG. 13A is a circuit diagram illustrating a semiconductor device of this embodiment.

A transistor including a semiconductor material (e.g., silicon) other than an oxide semiconductor can be used as a transistor 260 illustrated in FIG. 13A and thus the transistor 260 can easily operate at high speed. Further, a structure similar to that of the transistor described in Embodiment 4 which includes the oxide semiconductor layer of one embodiment of the present invention can be employed for a transistor 262 to enable charge to be held for a long time owing to its characteristics.

Although the transistors are n-channel transistors here, p-channel transistors can be used as the transistors used for the semiconductor device described in this embodiment.

In FIG. 13A, a first wiring (1st Line) is electrically connected to a source electrode layer of the transistor 260. A second wiring (2nd Line) is electrically connected to a drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) is electrically connected to the other electrode of the capacitor 264.

The semiconductor device in FIG. 13A utilizes a characteristic in which the potential of the gate electrode layer of the transistor 260 can be held, and thus enables writing, storing, and reading of data as follows.

Writing and storing of data are described. First, the potential of the fourth wiring is set to a potential at which the transistor 262 is turned on, so that the transistor 262 is turned on. Accordingly, the potential of the third wiring is supplied to the gate electrode layer of the transistor 260 and the capacitor 264. That is, a predetermined charge is supplied to the gate electrode layer of the transistor 260 (writing). Here, one of two kinds of charges providing different potential levels (hereinafter referred to as a low-level charge and a high-level charge) is supplied. After that, the potential of the fourth wiring is set to a potential at which the transistor 262 is turned off, so that the transistor 262 is turned off. Thus, the charge supplied to the gate electrode layer of the transistor 260 is held (holding).

Since the off-state current of the transistor 262 is extremely low, the charge of the gate electrode layer of the transistor 260 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where the high-level charge is given to the gate electrode layer of the transistor 260 is lower than an apparent threshold voltage $V_{th\_L}$ in the case where the low-level charge is given to the gate electrode layer of the transistor 260. Here, an apparent threshold voltage refers to the potential of the fifth wiring width is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where the high-level charge is supplied in writing, when the potential of the fifth wiring is $V_0$ ($>V_{th\_H}$), the transistor 260 is turned on. In the case where the low-level charge is supplied in writing, even when the potential of the fifth wiring is $V_0$ ($<V_{th\_L}$), the transistor 260 remains off. Therefore, the stored data can be read by the potential of the second wiring.

Note that in the case where memory cells are arrayed, it is necessary that only data of a desired memory cell be able to be read. The fifth wiring in the case where data is not read may be supplied with a potential at which the transistor 260 is turned off regardless of the state of the gate electrode layer, that is, a potential lower than $V_{th\_H}$. Alternatively, the fifth wiring may be supplied with a potential at which the transistor 260 is turned on regardless of the state of the gate electrode layer, that is, a potential higher than $V_{th\_L}$.

Figure 13B:
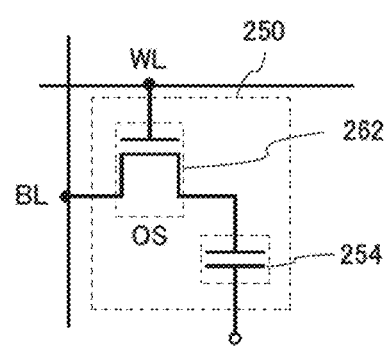
Figure 13C:
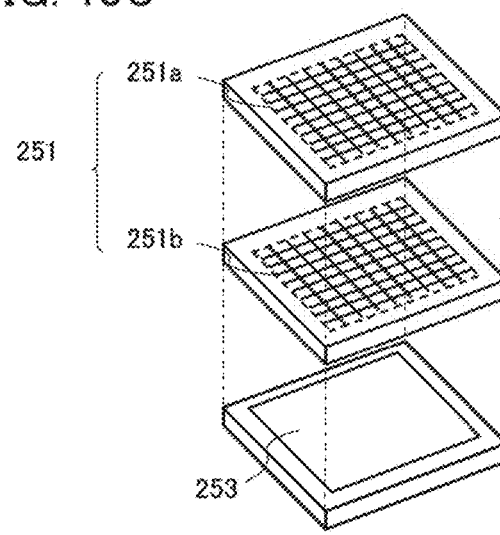

FIG. 13B illustrates another example of one embodiment of the structure of the storage device. FIG. 13B illustrates an example of a circuit configuration of the semiconductor device, and FIG. 13C is a conceptual diagram illustrating an example of the semiconductor device. First, the semiconductor device illustrated in FIG. 13B is described, and then the semiconductor device illustrated in FIG. 13C is described.

In the semiconductor device illustrated in FIG. 13B, a bit line BL is electrically connected to the source electrode or the drain electrode of the transistor 262, a word line WL is electrically connected to the gate electrode layer of the transistor 262, and the source electrode or the drain electrode of the transistor 262 is electrically connected to a first terminal of a capacitor 254.

Here, the transistor 262 including an oxide semiconductor has an extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 13B are described.

First, the potential of the word line WL is set to a potential at which the transistor 262 is turned on, and the transistor 262 is turned on. Accordingly, the potential of the bit line BL is supplied to the first terminal of the capacitor 254 (writing). After that, the potential of the word line WL is set to a potential at which the transistor 262 is turned of, so that the transistor 262 is turned off. Thus, the potential of the first terminal of the capacitor 254 is held (holding).

Since the transistor 262 has an extremely low off-state current, the potential of the first terminal of the capacitor 254 (or a charge accumulated in the capacitor 254) can be held for an extremely long time.

Next, reading of data is described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1 (=(C_B \times V_{B0} + C \times V_1)/(C_B + C))$ is higher than the potential of the bit line BL in the case of holding the potential $V_0 (=(C_B \times V_{B0} + C \times V_0)/(C_B + C))$.

Then, by comparing, the potential of the bit line BL with a predetermined potential, data can be read.

As described above, the semiconductor device illustrated in FIG. 13B can hold charge that is accumulated in the capacitor 254 for a long time because the off-state current of the transistor 262 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 13C is described.

The semiconductor device illustrated in FIG. 13C includes a memory cell array 251 (memory cell arrays 251a and 251b) including the plurality of memory cells 250 illustrated in FIG. 13B as memory circuits in the upper portion, and a peripheral circuit 253 in the lower portion which is necessary for operating the memory cell array 251. Note that the peripheral circuit 253 is electrically connected to the memory cell array 251.

In the structure illustrated in FIG. 13C, the peripheral circuit 253 can be provided directly under the memory cell array 251 (the memory cell arrays 251a and 251b). Thus, the size of the semiconductor device can be reduced.

It is preferable that a semiconductor material of the transistor provided in the peripheral circuit 253 be different from that of the transistor 262. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 13C illustrates, as an example, the semiconductor device in which two memory cell arrays 251 (the memory cell arrays 251a and 251b) are stacked; however, the number of stacked memory cell arrays is not limited to two. Three or more memory cells arrays may be stacked.

When a transistor including the oxide semiconductor layer of one embodiment of the present invention in a channel formation region is used as the transistor 262, stored data can be retained for a long period. In other words, refresh operation becomes unnecessary or the frequency of the refresh operation in a semiconductor memory device can be extremely low, which leads to a sufficient reduction in power consumption.

The methods and structures described in this embodiment can be combined as appropriate with any of the methods and structures described in the other embodiments.

Embodiment 7

In this embodiment, a structure of a display panel of one embodiment of the present invention will be described with reference to FIGS. 14A to 14C.

Figure 14A:
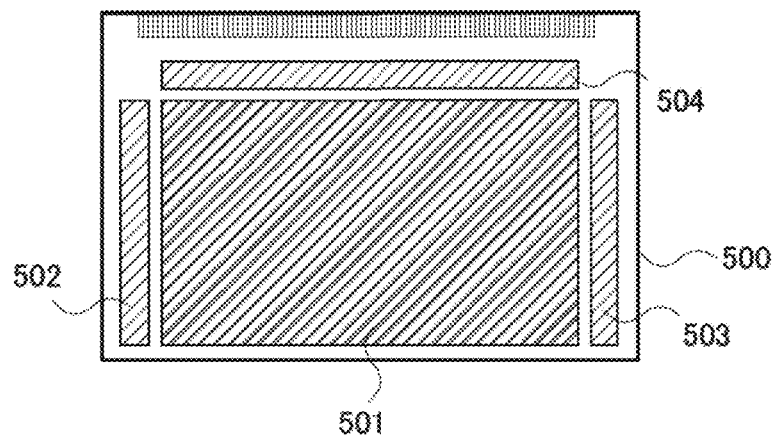
FIGS. 14A to 14C illustrate a structure of a display panel of one embodiment.

FIG. 14A is a top view of the display panel of one embodiment of the present invention. FIG. 14B is a circuit diagram illustrating a pixel circuit that can be used in the case where a liquid crystal element is used in a pixel in the display panel of one embodiment of the present invention. FIG. 14C is a circuit diagram illustrating a pixel circuit that can be used in the case where an organic EL element is used in a pixel in the display panel of one embodiment of the present invention.

The transistor in the pixel portion can be formed in accordance with Embodiment 3. Further, the transistor can be easily formed as an n-channel transistor, and thus part of a driver circuit that can be formed using an n-channel transistor can be formed over the same substrate as the transistor of the pixel portion. With the use of the transistor described in Embodiment 3 for the pixel portion or the driver circuit in this manner, a highly reliable display device can be provided.

FIG. 14A illustrates an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels which include display elements are provided in a matrix in respective regions where the scan lines and the signal lines intersect with each other. The substrate 500 of the display device is connected to a timing control circuit (also referred to as a controller or a controller IC) through a connection portion such as a flexible printed circuit (FPC).

In FIG. 14A, the first scan line driver circuit 502, the second scan line driver circuit 503, and the signal line driver circuit 504 are formed over the same substrate 500 as the pixel portion 501. Accordingly, the number of components which are provided outside, such as a driver circuit, can be reduced, so that a reduction in cost can be achieved. Further, in the case where the driver circuit is provided outside the substrate 500, wirings would need to be extended and the number of connections of wirings would be increased, but when the driver circuit is provided over the substrate 500, the number of connections of the wirings can be reduced. Consequently an improvement in reliability or yield can be achieved.

<Liquid Crystal Panel>

Figure 14B:
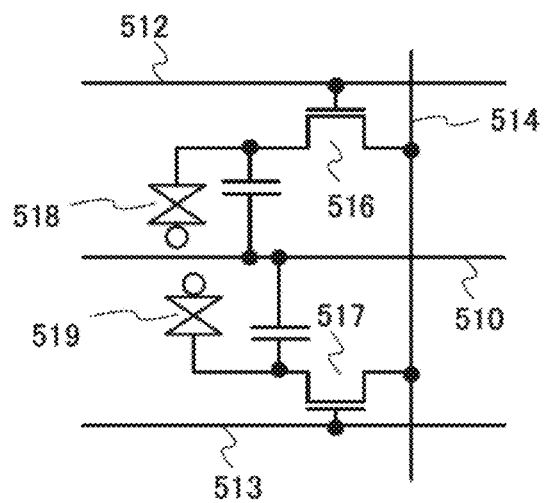

FIG. 14B illustrates an example of a circuit configuration of the pixel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 512 of a transistor 516 and a gate wiring 513 of a transistor 517 are separated so that different gate signals can be supplied thereto. In contrast, a source or drain electrode layer 514 that functions as a data line is shared by the transistors 516 and 517. The transistor described in Embodiment 3 can be used as appropriate as each of the transistors 516 and 517. Thus, a highly reliable liquid crystal display panel can be provided.

The shapes of a first pixel electrode layer electrically connected to the transistor 516 and a second pixel electrode layer electrically connected to the transistor 517 are described. The first pixel electrode layer and the second pixel electrode layer are separated by a slit. The first pixel electrode layer is spread in a V shape and the second pixel electrode layer is provided so as to surround the first pixel electrode layer.

A gate electrode layer of the transistor 516 is connected to the gate wiring 512, and a gate electrode layer of the transistor 517 is connected to the gate wiring 513. When different gate signals are supplied to the gate wiring 512 and the gate wiring 513, operation timings of the transistor 516 and the transistor 517 can be varied. As a result, alignment of liquid crystals can be controlled.

Further, a storage capacitor may be formed using a capacitor wiring 510, a gate insulating layer that functions as a dielectric, and a capacitor electrode electrically connected to the first pixel electrode layer or the second pixel electrode layer.

The multi-domain pixel includes a first liquid crystal element 518 and a second liquid crystal element 519. The first liquid crystal element 518 includes the first pixel electrode layer, a counter electrode layer, and a liquid crystal layer therebetween. The second liquid crystal element 519 includes the second pixel electrode layer, a counter electrode layer, and a liquid crystal layer therebetween.

Note that a pixel circuit of the present invention is not limited to that shown in FIG. 14B. For example, a switch, a resistor, a capacitor, a transistor, a sensor, a logic circuit, or the like may be added to the pixel illustrated in FIG. 14B.

<Organic EL Panel>

Figure 14C:
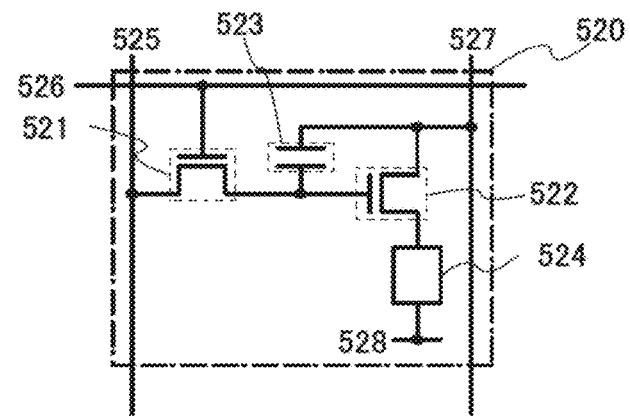

FIG. 14C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound: thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 14C illustrates an applicable example of a pixel circuit. Here, one pixel includes two n-channel transistors. Note that the oxide semiconductor layer of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 520 includes a switching transistor 521, a driver transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driver transistor 522. The gate electrode layer of the driver transistor 522 is connected to a power supply line 527 through the capacitor 523, a first electrode of the driver transistor 522 is connected to the power supply line 527, and a second electrode of the driver transistor 522 is connected to a first electrode (a pixel electrode) of the light-emitting element 524. A second electrode of the light-emitting element 524 corresponds to a common electrode 528. The common electrode 528 is electrically connected to a common potential line formed over the same substrate as the common electrode 528.

As the switching transistor 521 and the driver transistor 522, the transistor described in Embodiment 3 can be used as appropriate. In this manner, a highly reliable organic EL display panel can be provided.

The potential of the second electrode (the common electrode 528) of the light-emitting element 524 is set to be a low power supply potential. Note that the low power supply potential is lower than a high power supply potential supplied to the power supply line 527. For example, the low power supply potential can be GND, 0V or the like. The high power supply potential and the low power supply potential are set to be higher than or equal to the forward threshold voltage of the light-emitting element 524, and the difference between the potentials is applied to the light-emitting element 524, whereby current is supplied to the light-emitting element 524, leading to light emission. The forward voltage of the light-emitting element 524 refers to a voltage at which a desired luminance is obtained, and is at least higher than a forward threshold voltage.

Note that gate capacitance of the driver transistor 522 may be used as a substitute for the capacitor 523, so that the capacitor 523 can be omitted. The gate capacitance of the driver transistor 522 may be thrilled between the channel formation region and the gate electrode layer.

Next, a signal input to the driver transistor 522 is described. In the case of a voltage-input voltage driving method, a video signal for substantially turning on or off the driver transistor 522 is input to the driver transistor 522. In order for the driver transistor 522 to operate in a linear region, voltage higher than the voltage of the power supply line 527 is applied to the gate electrode layer of the driver transistor 522. Note that voltage greater than or equal to voltage which is the sum of power supply line voltage and the threshold voltage $V_{th}$ of the driver transistor 522 is applied to the signal line 525.

In the case of performing analog grayscale driving, a voltage greater than or equal to a voltage which is the sum of the forward voltage of the light-emitting element 524 and the threshold voltage $V_{th}$ of the driver transistor 522 is applied to the gate electrode layer of the driver transistor 522. A video signal by which the driver transistor 522 is operated in a saturation region is input, so that current is supplied to the light-emitting element 524. In order for the driver transistor 522 to operate in a saturation region, the potential of the power supply line 527 is set higher than the gate potential of the driver transistor 522. When an analog video signal is used, it is possible to supply current to the light-emitting element 524 in accordance with the video signal and perform analog grayscale driving.

Note that the configuration of the pixel circuit of the present invention is not limited to that shown in FIG. 14C. For example, a switch, a resistor, a capacitor, a sensor, a transistor, a logic circuit, or the like may be added to the pixel circuit illustrated in FIG. 14C.

The methods and structures described in this embodiment can be combined as appropriate with any of the methods and structures described in the other embodiments.

Embodiment 8

In this embodiment, structures of a semiconductor device including the oxide semiconductor layer of one embodiment of the present invention and electronic devices will be described with reference to FIG. 15 and FIGS. 16A to 16D.

Figure 15:
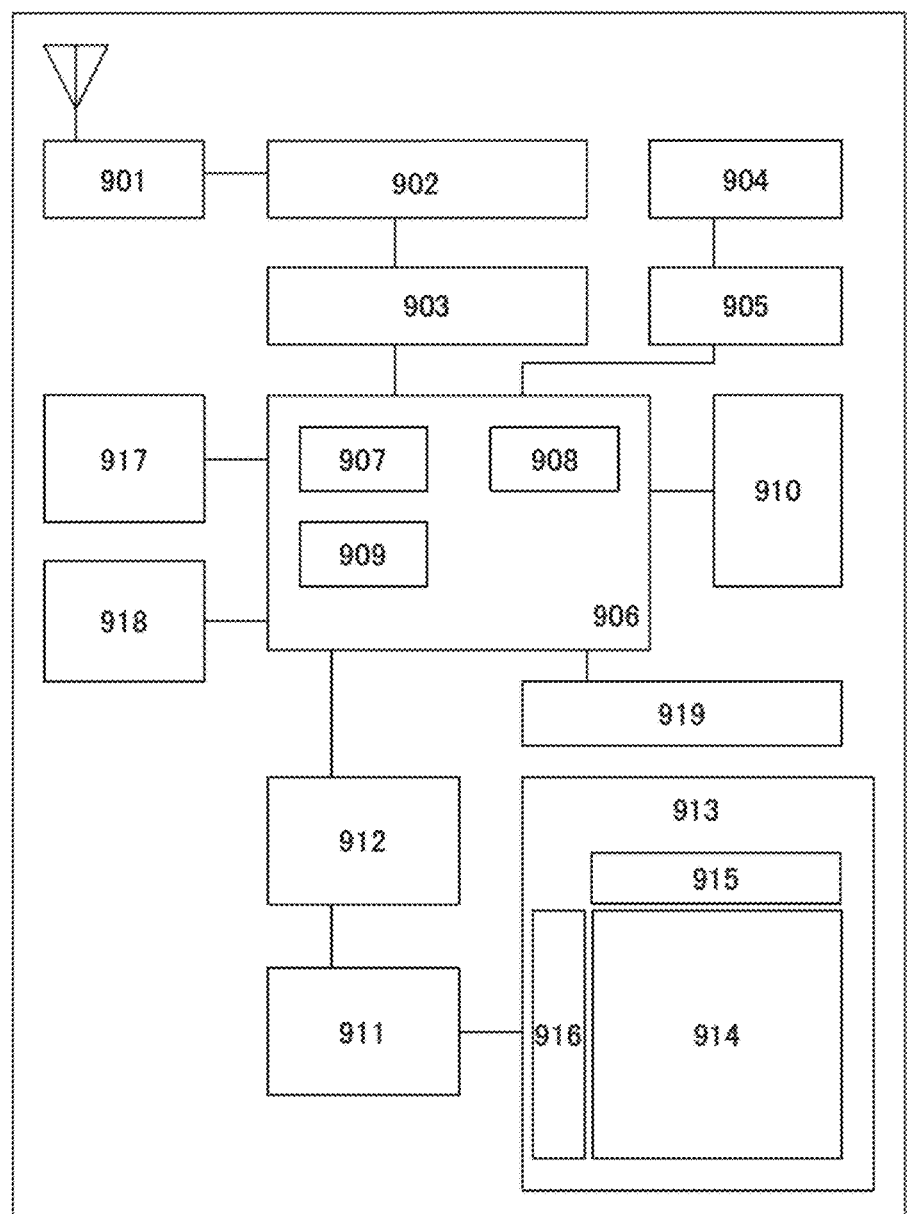
FIG. 15 is a block diagram of an electronic device of one embodiment.

FIG. 15 is a block diagram of an electronic device including, the semiconductor device to which the oxide semiconductor layer of one embodiment of the present invention is applied.

FIGS. 16A to 16D are external views of electronic devices each including the semiconductor device to which the oxide semiconductor layer of one embodiment of the present invention is applied.

An electronic device illustrated in FIG. 15 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like.

The application processor 906 includes a CPU 907, a DSP 908, and an interface (IF) 909. Moreover, the memory circuit 912 can include an SRAM or a DRAM.

The transistor described in Embodiment 3 is applied to the memory circuit 912, whereby a highly reliable electronic device which can write and read data can be provided.

The transistor described in Embodiment 3 is applied to a register or the like included in the CPU 907 or the DSP 908, whereby a highly reliable electronic device which can write and read data can be provided.

Note that in the case where the off-state leakage current of the transistor described in Embodiment 3 is extremely low the memory circuit 912 can retain stored data for a long period and can have sufficiently reduced power consumption. Moreover, the CPU 907 or the DSP 908 can store the state before power gating in a register or the like during a period in which the power gating is performed.

Further, the display 913 includes a display portion 914, a source driver 915, and a gate driver 916.

The display portion 914 includes a plurality of pixels arranged in a matrix. The pixel includes a pixel circuit, and the pixel circuit is electrically connected to the gate driver 916.

The transistor described in Embodiment 3 can be used as appropriate in the pixel circuit or the gate driver 916. Accordingly, a highly reliable display can be provided.

Examples of electronic devices are a television set (also referred to as a television or a television receiver) a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 16A:
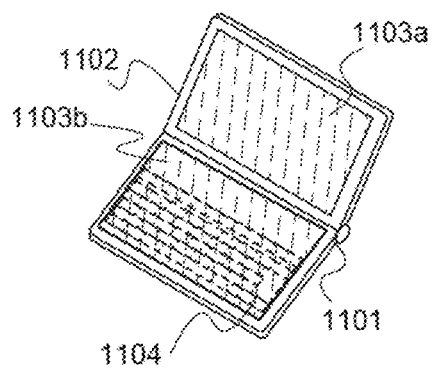
FIGS. 16A to 16D are each an external view of an electronic device of one embodiment.

FIG. 16A illustrates a portable information terminal, which includes a main body 1101, a housing 1102, a display portion 1103a, a display portion 1103b, and the like. The display portion 1103b includes a touch panel. By touching a keyboard button 1104 displayed on the display portion 1103b, screen operation can be carried out, and text can be input. Needless to say, the display portion 1103a may functions as a touch panel. A liquid crystal panel or an organic light-emitting panel is manufactured by using the transistor described in Embodiment 3 as a switching element and applied to the display portion 1103a or 1103b, whereby a highly reliable portable information terminal can be provided.

The portable information terminal illustrated in FIG. 16A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Further, an external connection terminal (an earphone terminal, a USB terminal, or the like), a recording medium insertion portion, or the like may be provided on the back surface or the side surface of the housing.

The portable information terminal illustrated in FIG. 16A may transmit and receive data wirelessly. Through wireless communication, desired book data or the like can be purchased and downloaded from an electronic book server.

Figure 16B:
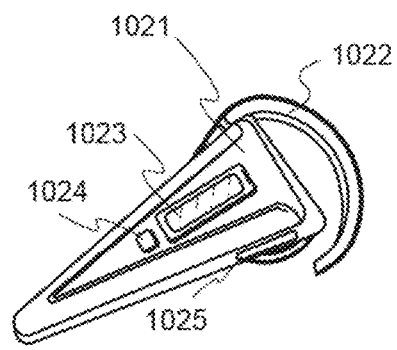

FIG. 16B illustrates a portable music player, which includes in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in Embodiment 3 as a switching element and applied to the display portion 1023, whereby a highly reliable portable music player can be provided.

Furthermore, when the portable music player illustrated in FIG. 16B has an antenna, a microphone function, or a wireless communication function and is used with a mobile phone, a user can talk on the phone wirelessly in a hands-free way while driving a car or the like.

Figure 16C:
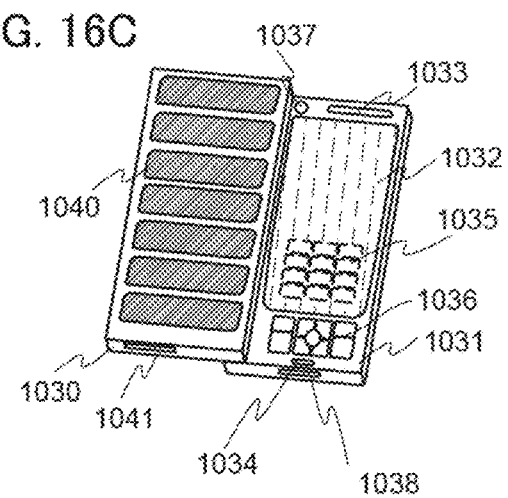

FIG. 16C illustrates a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in Embodiment 3 is applied to the display panel 1032, whereby a highly reliable mobile phone can be provided.

Further, the display panel 1032 includes a touch panel. A plurality of operation keys 1035 which are displayed as images are indicated by dotted lines in FIG. 16C. Note that a boosting circuit by which a voltage output from the solar cell 1040 is increased so as to be sufficiently high for each circuit is also included.

For example, a power transistor used for a power supply circuit such as a boosting circuit can also be formed when the oxide semiconductor layer of the transistor described in the Embodiment 3 has a thickness greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 16C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 16D:
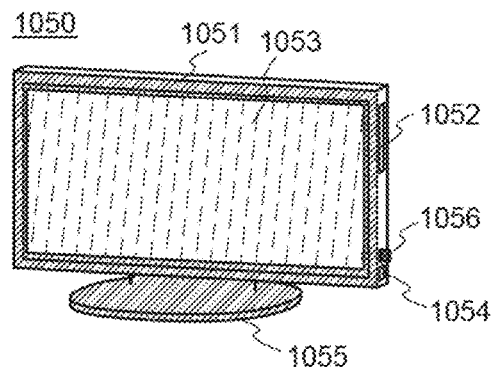

FIG. 16D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. The transistor described in Embodiment 3 is applied to the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, the television set 1050 can receive general TV broadcasts. Moreover, when the television set 1050 is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, whereby data communication with a personal computer or the like is possible. A disk storage medium is inserted into the storage medium recording and reproducing portion 1052, and data stored in the storage medium can be read and data can be written to the storage medium. In addition, an image, a video, or the like stored as data in an external memory 1056 inserted into the external memory slot can be displayed on the display portion 1053.

Further, in the case where the off-state leakage current of the transistor described in Embodiment 3 is extremely low, when the transistor is applied to the external memory 1056 or the CPU, the television set 1050 can have high reliability and sufficiently reduced power consumption.

Example 1

In this example, a nanocrystal included in the oxide semiconductor layer of one embodiment of the present invention will be described below with an electron diffraction pattern of a nanocrystalline oxide semiconductor film.

An electron diffraction pattern obtained by electron diffraction with a beam diameter of 10 nmϕ or less (nanobeam electron diffraction) of a nanocrystalline oxide semiconductor film is neither a halo pattern indicating an amorphous state nor a pattern with spots having regularity indicating a crystalline state in which crystals are aligned with a specific plane. That is, the nanocrystalline oxide semiconductor film is an oxide semiconductor film whose electron diffraction pattern has spots not having directionality.

Figure 17A:
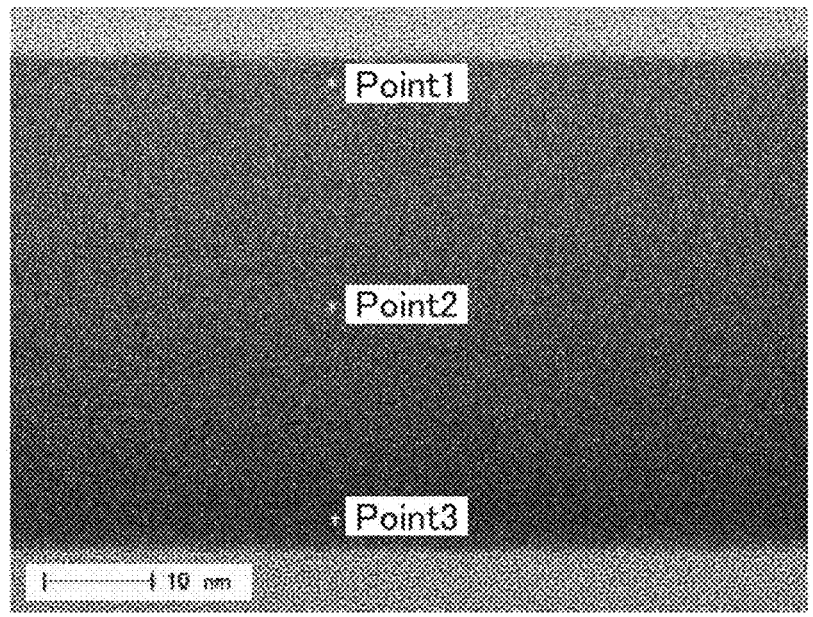
FIGS. 17A to 17D show a cross-sectional TEM image and nanobeam electron diffraction patterns of a nanocrystalline oxide semiconductor layer.
Figure 17B:
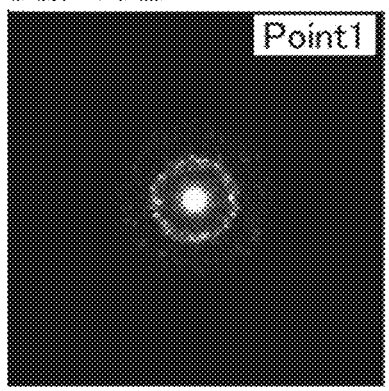
Figure 17C:
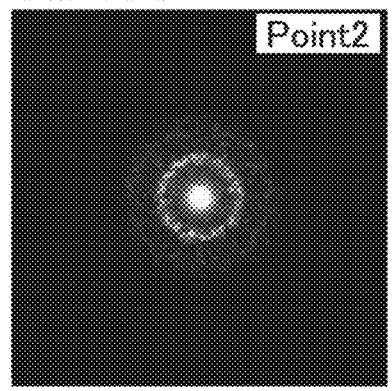
Figure 17D:
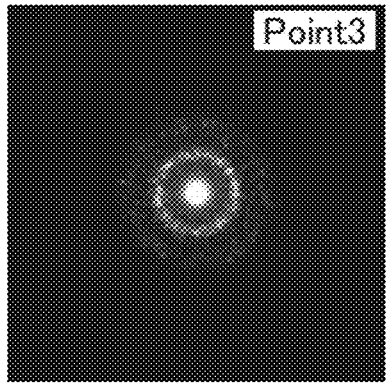

FIG. 17A is a cross-sectional transmission electron microscopy (TEM) image of a nanocrystalline oxide semiconductor film. FIGS. 17B, 17C, and 17D show electron diffraction patterns obtained by nanobeam electron diffraction performed on Points 1, 2, 3 in FIG. 17A, respectively.

A sample in which an In—Ga—Zn-based oxide film was formed, as an example of the nanocrystalline oxide semiconductor film in FIGS. 17A to 17D, over a quartz glass substrate to a thickness of 50 nm was used. The nanocrystalline oxide semiconductor film shown in FIGS. 17A to 17D was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (pc) power of 0.5 kW was applied, and the substrate temperature was room temperature. Then, the width of the formed nanocrystalline oxide semiconductor film was reduced to 100 nm or less (e.g., 40 nm±10 nm), and a cross-sectional TEM image and nanobeam electron diffraction patterns were obtained.

FIG. 17A is the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 2,000,000 times. FIGS. 17B to 17D show the electron diffraction patterns obtained by nanobeam electron diffraction with a beam diameter of about 1 nmϕ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 is greater than or equal to 5 nmϕ and less than or equal to 10 nmϕ.

As shown in FIG. 17B, in the nanobeam electron diffraction pattern of the nanocrystalline oxide semiconductor film, a plurality of circumferentially arranged spots (bright points) are observed. In other words, in the pattern of the nanocrystalline oxide semiconductor film a plurality of circumferentially (concentrically) distributed spots are observed, or a plurality of circumferentially distributed spots form a plurality of concentric circles.

In FIG. 17C showing the central portion of the nanocrystalline oxide semiconductor film in the thickness direction and in FIG. 17D showing the vicinity of an interface between the nanocrystalline oxide semiconductor film and the quartz glass substrate, a plurality of circumferentially distributed spots are observed as in FIG. 17B. In FIG. 17C, a radius to a first circumference (the distance from a main spot) is in a range from 3.88/nm to 4.93/nm, or from 0.203 nm to 0.257 nm when converted into interplanar spacing.

The nanobeam electron diffraction patterns shown in FIGS. 17B to 17D indicate that the nanocrystalline oxide semiconductor film includes a plurality of crystal parts whose surface orientations are random and whose sizes are different from each other.

Figure 18A:
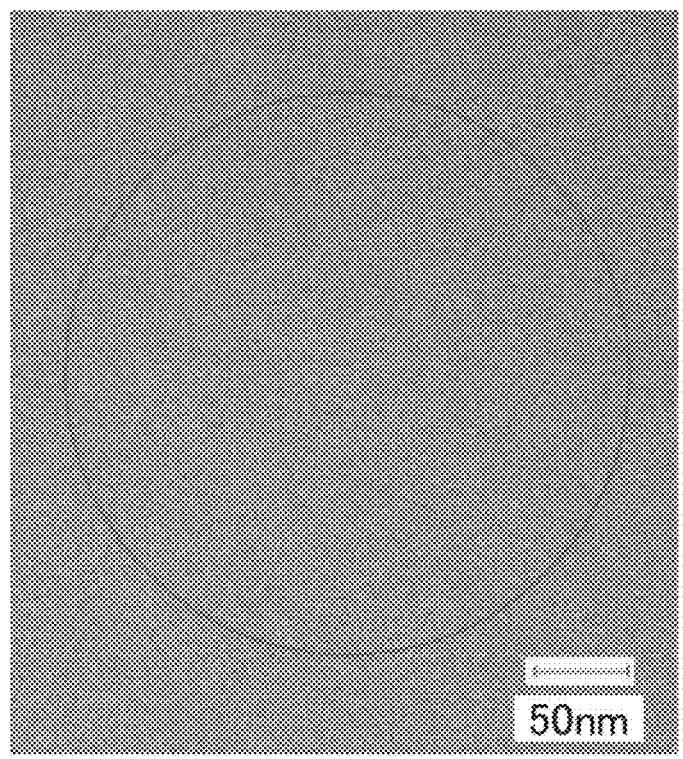
FIGS. 18A and 18B show a plane TEM image and a selected-area electron diffraction pattern of a nanocrystalline oxide semiconductor layer.
Figure 18B:
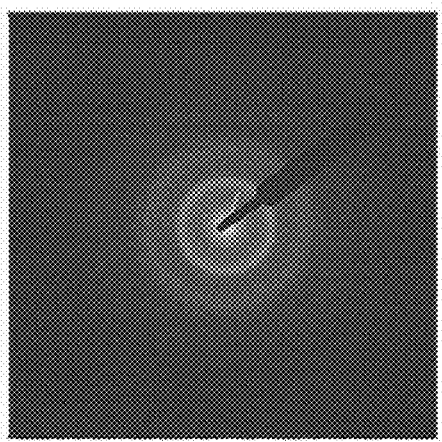

FIG. 18A is a plane TEM image of a nanocrystalline oxide semiconductor film. FIG. 18B shows an electron diffraction pattern obtained by selected-area electron diffraction performed on a region surrounded by a circle in FIG. 18A.

A sample in which an In—Ga—Zn-based oxide film was formed, as an example of the nanocrystalline oxide semiconductor film shown in FIGS. 18A and 18B, over a quartz glass substrate to a thickness of 30 nm was used. The nanocrystalline oxide semiconductor film shown in FIGS. 18A and 18B was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the sample was thinned, and the plane TEM image and the selected-area electron diffraction pattern of the nanocrystalline oxide semiconductor film were obtained.

FIG. 18A is the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000 times. FIG. 18B is the electron diffraction pattern obtained by electron diffraction with a selected area of 300 nmϕ. Note that the measurement area is greater than or equal to 300 nmϕ in consideration of electron beam expansion.

As shown in FIG. 18B, the electron diffraction pattern of the nanocrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 19A:
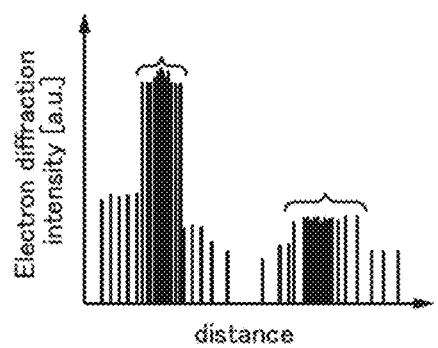
FIGS. 19A to 19C are conceptual diagrams of electron diffraction intensity distribution.
Figure 19B:
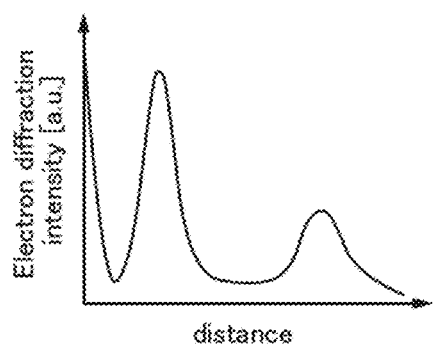
Figure 19C:
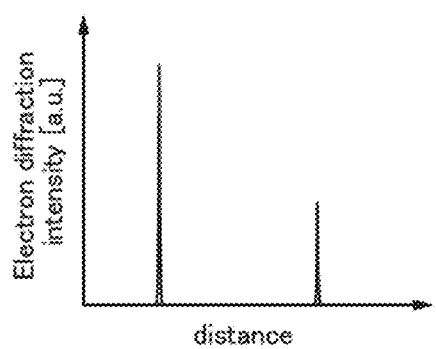

FIGS. 19A to 19C conceptually show diffraction intensity distribution in the electron diffraction patterns shown in FIGS. 17B to 17D and FIG. 18B. FIG. 19A is a conceptual diagram showing diffraction intensity distribution in the nanobeam electron diffraction patterns shown in FIGS. 17B to 17D. FIG. 19B is a conceptual diagram showing diffraction intensity distribution in the selected-area electron diffraction pattern shown in FIG. 18B. FIG. 19C is a conceptual diagram showing diffraction intensity distribution in an electron diffraction pattern of a single crystal structure or a polycrystalline structure.

In each of FIGS. 19A to 19C, the vertical axis represents the electron diffraction intensity (arbitrary unit) indicating distribution of spots or the like and the horizontal axis represents the distance from a main spot.

In FIG. 19C for the single crystal structure or the polycrystalline structure, peaks are observed at specific distances from the main spot, which are based on interplanar spacing (d value) between planes with which crystal parts are aligned.

As shown in each of FIGS. 17B to 17D, a circumferential region formed by the plurality of spots observed in the nanobeam electron diffraction pattern of the nanocrystalline oxide semiconductor film has a relatively large width. Thus, FIG. 19A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 19B. Since FIG. 19B can approximate a result obtained by widely observing the electron diffraction intensity distribution shown in FIG. 19A, the continuous intensity distribution can be considered to result from the overlapping and connection of the plurality of spots.

FIGS. 19A to 19C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 17B to 17D in which the plurality of spots are observed, the width of the nanocrystalline oxide semiconductor film is 50 nm or less. Further, since the diameter of the electron beam was reduced to 1 nmϕ, the measurement area is greater than or equal to 5 nm and less than or equal to 10 nm. Thus, it is assumed that the diameter of the crystal part included in the nanocrystalline oxide semiconductor film is 50 nm or less, for example, 10 nm or less or 5 nm or less.

Figure 20:
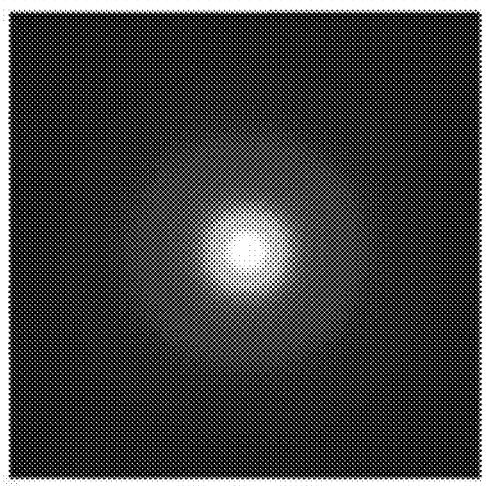
FIG. 20 shows a nanobeam electron diffraction pattern of a quartz glass substrate.

FIG. 20 shows a nanobeam electron diffraction pattern of a quartz glass substrate. The measurement conditions were similar to those for the electron diffraction patterns shown in FIGS. 17B to 17D.

As shown in FIG. 20, the nanobeam election diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 17B to 17D are peculiar to the nanocrystalline oxide semiconductor film.

Figure 21:
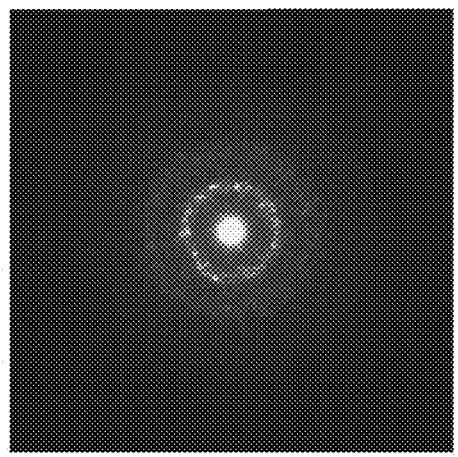
FIG. 21 shows a nanobeam electron diffraction pattern of a nanocrystalline oxide semiconductor layer.

FIG. 21 shows an electron diffraction pattern obtained after one-minute irradiation of Point 2 in FIG. 17A with an electron beam whose diameter was reduced to about 1 nmϕ.

As in the electron diffraction pattern shown in FIG. 17C, a plurality of circumferentially distributed spots are observed in the electron diffraction pattern shown in FIG. 21, and there is no significant difference from FIG. 17C. This means that the crystal part observed in the electron diffraction pattern shown in FIG. 17C existed at the time of the formation of the oxide semiconductor film and did not result from irradiation with the electron beam with the reduced diameter.

Figure 22A:
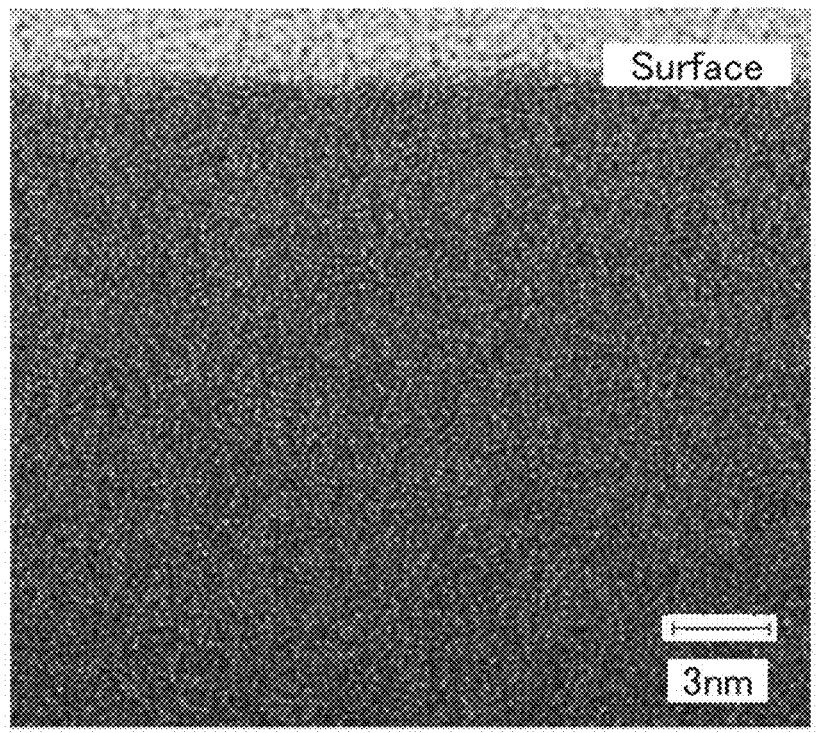
FIGS. 22A and 22B show cross-sectional TEM images of a nanocrystalline oxide semiconductor layer.
Figure 22B:
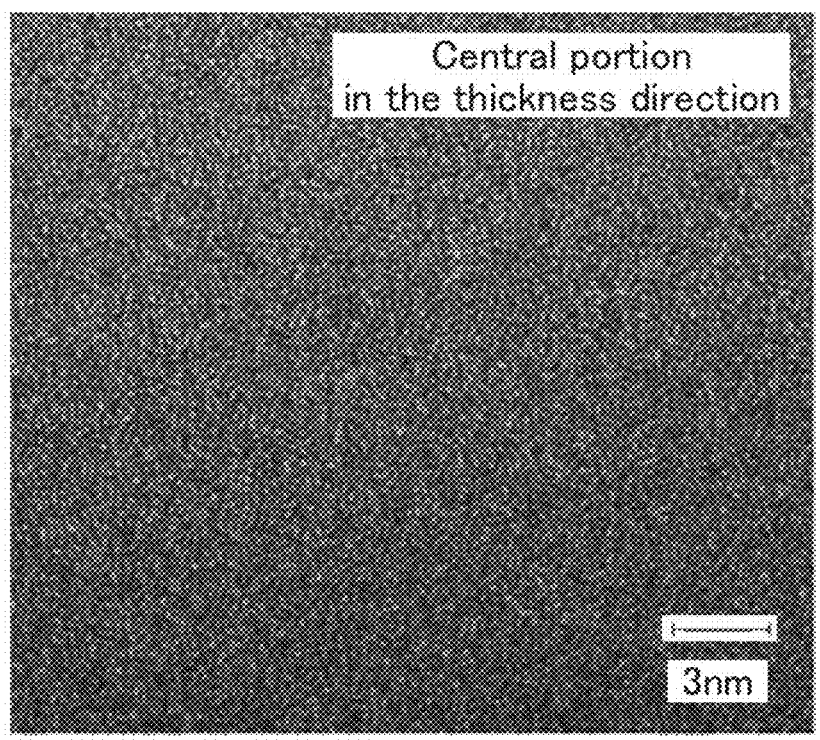

FIGS. 22A and 22B are enlarged images of portions in the cross-sectional TEM image of FIG. 17A. FIG. 22A is a cross-sectional TEM image of the vicinity of Point 1 (the surface of the nanocrystalline oxide semiconductor film) in FIG. 17A, which was observed at an observation magnification of 8,000,000 times. FIG. 22B is a cross-sectional TEM image of the vicinity of Point 2 (the central portion of the nanocrystalline oxide semiconductor film in the thickness direction) in FIG. 17A, which was observed at an observation magnification of 8000,000 times.

According to each of the TEM images of FIGS. 22A and 22B, a crystalline structure cannot be clearly observed in the nanocrystalline oxide semiconductor film.

Figure 23:
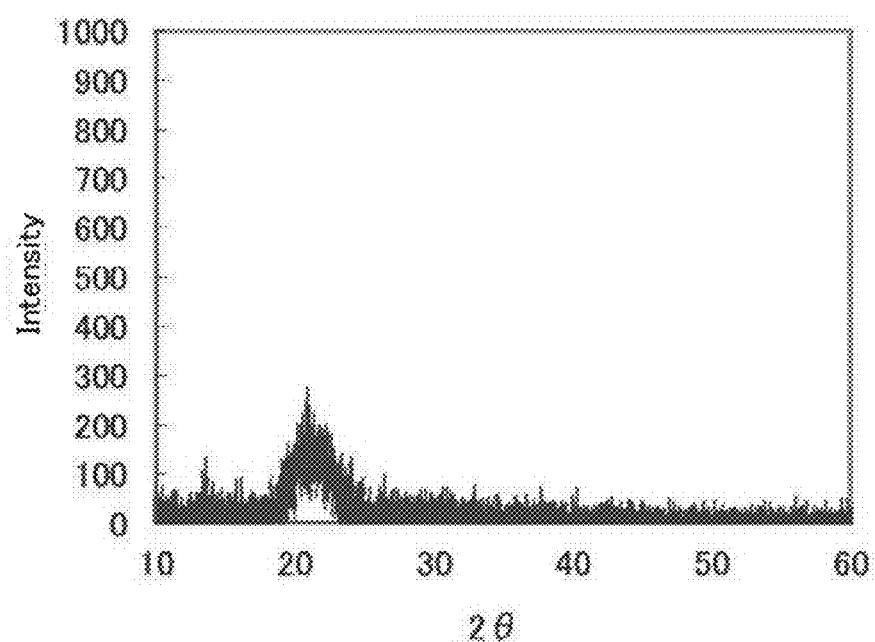
FIG. 23 shows the result of X-ray diffraction analysis of a nanocrystalline oxide semiconductor layer.

The samples for the electron diffraction patterns shown in FIGS. 17A to 17D and FIGS. 18A and 18B, in each of which the nanocrystalline oxide semiconductor film of this embodiment was formed over the quartz glass substrate, were analyzed by X-ray diffraction (XRD). FIG. 23 shows an XRD spectrum of the samples measured by an out-of-plane method.

In FIG. 23, the vertical axis represents the X-rays diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 23, a peak corresponding to quartz is observed at around 2θ=20° to 23°; however, a peak corresponding to the crystal part included in the nanocrystalline oxide semiconductor film cannot be observed.

The results in FIGS. 22A and 22B and FIG. 23 also indicate that the crystal part included in the nanocrystalline oxide semiconductor film is minute.

As described above, in the case of the nanocrystalline oxide semiconductor film of his example, a peak indicating an orientation was not observed by X-ray diffraction (XRD) analysis the measurement area of which is wide and the electron diffraction pattern obtained by selected-area electron diffraction the measurement area of which is wide is a halo pattern. This indicates that the nanocrystalline oxide semiconductor film of this example is macroscopically equivalent to a film having disordered atomic arrangement. However, spots (bright points) can be observed in the nanobeam electron diffraction pattern of the nanocrystalline oxide semiconductor film which was obtained by nanobeam electron diffraction in which the diameter of an electron beam is sufficiently small (e.g., 10 nmϕ or less). Thus, it can be assumed that the nanocrystalline oxide semiconductor film of this example is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

Example 2

In this example, the adverse effect of an impurity in an oxide semiconductor layer on crystallinity of the oxide semiconductor layer was calculated.

In this example, hydrogen was assumed as an impurity contained in an oxide semiconductor layer, and a correlation between the amount of hydrogen added to the oxide semiconductor layer and the orderliness of the oxide semiconductor layer to which hydrogen was added was calculated by first-principles calculation.

Figure 24:
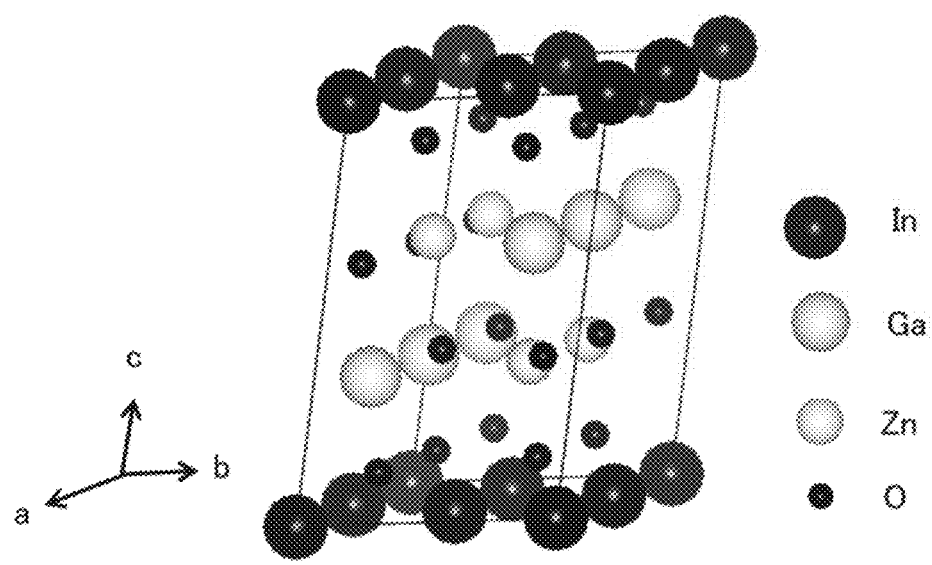
FIG. 24 shows a crystal structure of an oxide semiconductor layer used for calculation.

As the oxide semiconductor layer, an In—Ga—Zn oxide in which an atomic ratio of In to Ga and Zn is 1:1:1 was used. First, after the structures of 28 atoms shown in FIG. 24 were optimised, the lengths of the a-axis and b-axis were made twice so that a lattice including 112 atoms was obtained. Then, a difference between a structure in which hydrogen (H) was added to the lattice including the 112 atoms and a structure in which hydrogen (H) was not added to the lattice including the 112 atoms was examined in such manner that a temperature of each structure is changed and the movement of each atom of the respective structures was calculated.

In the structure in which was added in this example, 4 hydrogen atoms (hydrogen concentration of 3.45 atom %) or 8 hydrogen atoms (hydrogen concentration of 6.67 atom %) were added to the lattice including the 112 atoms of the In—Ga—Zn oxide in which an atomic ratio of In to Ga and Zn is 1:1:1. Here, the added hydrogen atolls were arranged in a lattice of a perfect crystal.

The classical molecular dynamics calculation was carried out on the structure in which a hydrogen atom was not added, the structure in which 4 hydrogen atoms were added, and the structure in which 8 hydrogen atoms were added, which were then analyzed by the radial distribution function to examine how the bonding strength in the In—Ga—Zn oxide to which hydrogen was added was changed and how the structure thereof was disordered. The calculation conditions are shown in Table 1. In the calculation, "Vienna Ab initio Simulation Package (VASP)" was used.

TABLE 1

| Calculation program | VASP |
| --- | --- |
| Basis function | plane-wave |
| Functional | GGA-PBE |
| Pseudopotential | PAW |
| Cut-off energy | 500 eV (optimization) |
| | 260 eV (classical molecular dynamics calculation) |
| Number of grids at k-point | 4 × 4 × 3 (optimization) |
| | 1 × 1 × 1 (classical molecular dynamics calculation) |
| Ensemble | NVT |
| Temperature | 2500 K |
| Time interval (fs) | 1.0 |
| Total calculation time (ps) | 5.0 |

Figure 25A:
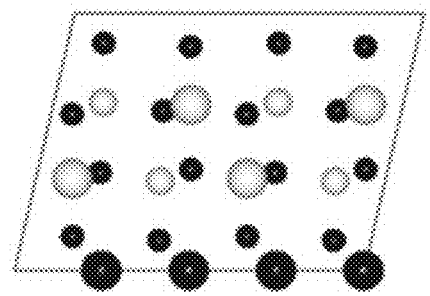
FIGS. 25A to 25D show the calculation results of an influence of hydrogen addition on a crystal state.
Figure 25B:
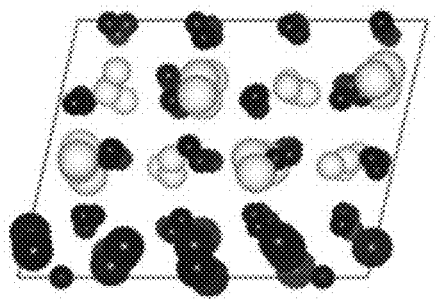
Figure 25C:
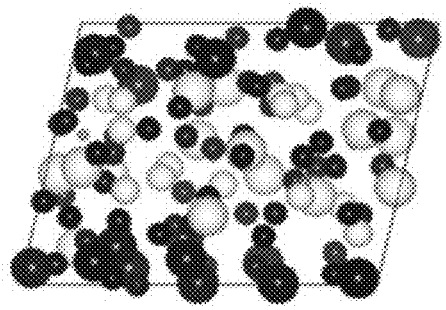
Figure 25D:
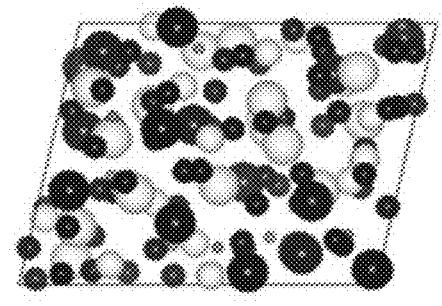

FIGS. 25A to 25D show calculation results. FIG. 25A shows an initial crystal structure of an In—Ga—Zn oxide. FIG. 25B shows the crystal structure of the In—Ga—Zn oxide after 5 picoseconds in which a hydrogen atom was not added, in the case where the temperature was set to 2500 K. FIG. 25C shows the crystal structure of the In—Ga—Zn oxide alter 5 picoseconds in which 4 hydrogen atoms (hydrogen concentration of 3.45 atom %) were added, in the case where the temperature was set to 2500 K. FIG. 25D shows the crystal structure of the In—Ga—Zn oxide after 5 picoseconds in which 8 hydrogen atoms (hydrogen concentration of 6.67 atom %) were added, in the case where the temperature was set to 2500 K.

According to FIGS. 25A to 25D, the crystal structure of the structure in which hydrogen atoms were added is more disordered than that of the structure in which a hydrogen atom was not added. This implies that the strength of bonding in the In—Ga—Zn oxide becomes lower due to addition of hydrogen.

In order to quantitatively evaluate the effect of addition of hydrogen on the bonding strength in the In—Ga—Zn oxide, the radial distribution function was calculated only with In, Ga, Zn, and O, which are elements other than hydrogen, in structures after 3 picoseconds to 5 picoseconds. The calculation results are shown in FIG. 26.

Figure 26:
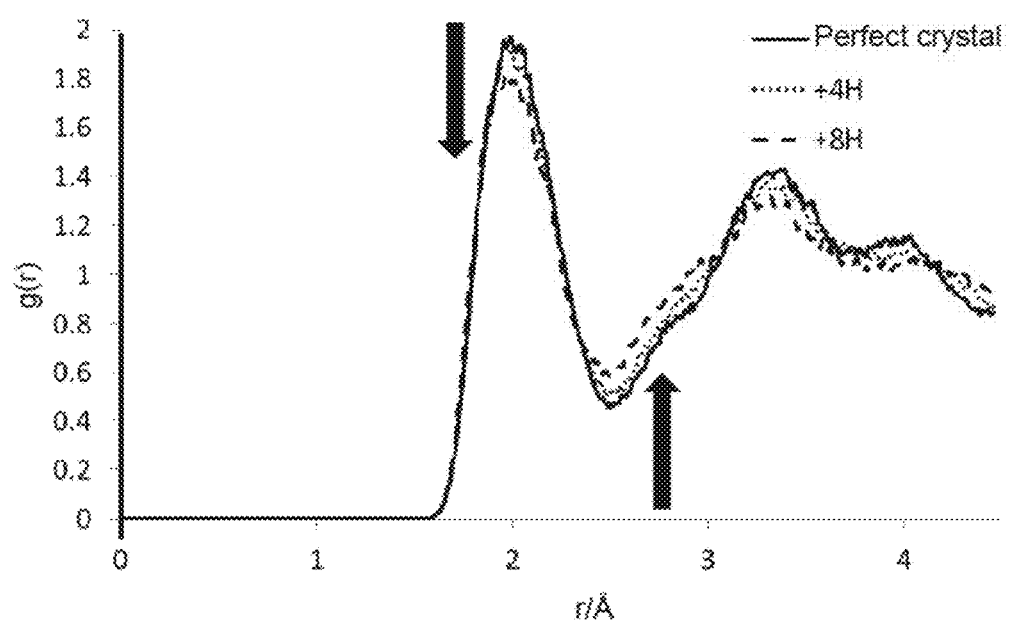
FIG. 26 shows the calculation result of a radial distribution function.

As shown in arrows in FIG. 26, a first peak gets lower and a valley between the first peak and a second peak gets shallower as a number of added hydrogen atoms is increased. Note that the radial distribution function g(r) is a function representing the probability density of atoms existing at a distance of r from one atom. As the correlation between atoms becomes smaller, g(r) becomes closer to 1. Therefore, the result of FIG. 26 shows that the bonding strength in the In—Ga—Zn oxide gets lower by addition of hydrogen and thus the structures are likely to be broken (disordered).

As described above, when the concentration of an impurity (here, hydrogen) in the oxide semiconductor layer gets higher, the structure of the oxide semiconductor layer is disordered and crystallinity thereof is lowered. Further, it can be said that an oxide semiconductor layer having an amorphous structure is a film containing a large amount of an impurity (here, hydrogen).

Example 3

In this example, results of comparison between oxide semiconductor layers which differ in crystal state by various methods are described.

First, a method for manufacturing a measurement sample used in this example is described below.

<Measurement Sample A>

A CAAC-OS layer was used for a measurement sample A. In the measurement sample A, an oxide semiconductor layer was formed by a sputtering method under the following conditions: an In—Ga—In-oxide target (the atomic ratio of In to Ga and Zn is 1:1:1) was used; an argon gas at a flow rate of 30 sccm and an oxygen gas at a flow rate of 15 sccm were used as a deposition gas; the pressure was 0.4 Pa; the substrate temperature was 400° C.; and a direct-current (DC) power of 0.5 kW was supplied. Note that a glass substrate was used as a substrate. Then, the oxide semiconductor layer was heated at 450° C. in a nitrogen atmosphere for one hour and then heated at 450° C. in an oxygen atmosphere for one hour, whereby hydrogen contained in the first oxide semiconductor layer was released and oxygen was supplied to the oxide semiconductor layer. The measurement sample A including the oxide semiconductor layer which is a CAAC-OS layer was obtained in the above manner.

Note that the film density of the measurement sample A was measured to be 6.3 g/cm$^3$ by X-ray reflectometry (XRR). In other words, the CAAC-OS film is a film with a high film density.

<Measurement Samples B1 and B2>

A nanocrystalline oxide semiconductor layer was used for a measurement sample B1 and a measurement sample B2. In the measurement sample B1, an oxide semiconductor layer was formed by a sputtering method under the following conditions: an In—Ga—Zn-oxide target (the atomic ratio of In to Ga and Zn is 1:1:1) was used: an argon gas at a flow rate of 30 sccm and an oxygen gas at a flow rate of 15 sccm were used as a deposition gas; the pressure was 0.4 Pa; the substrate temperature was room temperature; and a direct-current (DC) power of 0.5 kW was supplied. Note that a glass substrate was used as a substrate, and the measurement sample B1 including the oxide semiconductor layer which is a nanocrystalline oxide semiconductor layer was obtained in the above manner.

The measurement sample B2 was formed as follows: an oxide semiconductor layer which was formed in a manner similar to that of the oxide semiconductor layer of the measurement sample B1 was heated at 450° C. in a nitrogen atmosphere for one hour and then further heated at 450° C. in an oxygen atmosphere for one hour as treatment for releasing hydrogen contained in the oxide semiconductor layer and then treatment for supplying oxygen to the oxide semiconductor layer. The measurement sample B2 was obtained in the above manner.

Note that the film densities of the measurement samples B1 and B2 were measured by X-ray reflectometry (XRR). The film density of the measurement sample B1 was 5.9 g/cm$^3$, and the film density of the measurement sample B2 was 6.1 g/cm$^3$.

Thus, it is confirmed that the heat treatment can increase the film density of the oxide semiconductor film.

<Measurement Sample C>

A nanocrystalline oxide semiconductor layer whose hydrogen content is larger than those in the measurement samples B1 and B2 was used for a measurement sample C. As described in Example 2, the structure of the oxide semiconductor layer is disordered and crystallinity thereof is lowered by addition of hydrogen to the oxide semiconductor layer. Thus, it can be said that the measurement sample C is a nanocrystalline oxide semiconductor layer in which crystallinity is much lower than that of the measurement sample B1 and that of the measurement sample B2.

In the measurement sample C, the oxide semiconductor layer was formed by a sputtering method under the following conditions: an In—Ga—Zn-oxide target (the atomic ratio of In to Ga and Zn is 1:1:1) was used: a mixed gas of argon and hydrogen (Ar:H$_2$=14.8 sccm:0.2 sccm) was used as a deposition gas; the pressure was 2.0 Pa; the substrate temperature was room temperature; and a direct-current (DC) power of 200 W was supplied. The measurement sample C was obtained in the above manner.

Note that the film density of the measurement sample C was measured by X-ray reflectometry (XRR). The film density of the measurement sample C was 5.0 g/cm$^3$, and it is confirmed from this result that the film density is lowered by addition of hydrogen.

Figure 27A:
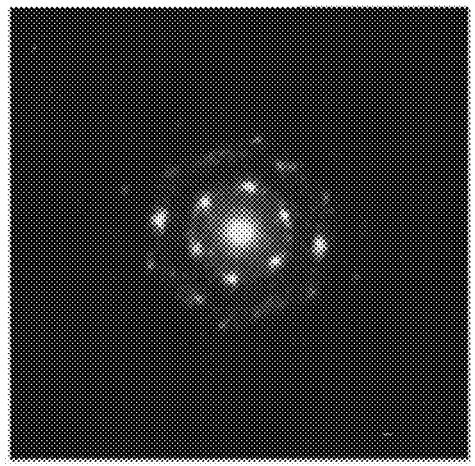
FIGS. 27A to 27C show nanobeam electron diffraction patterns of an oxide semiconductor layer obtained with a nanobeam electron beam.
Figure 27B:
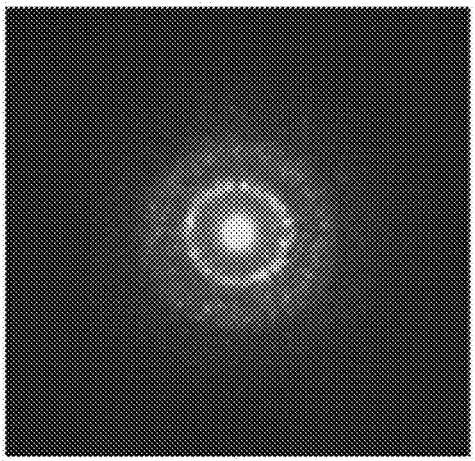
Figure 27C:
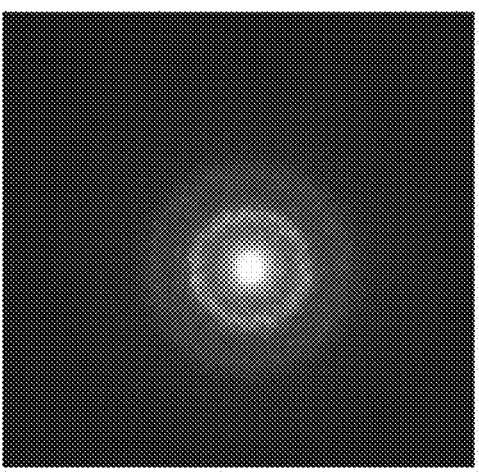

FIGS. 27A to 27C show nanobeam electron diffraction patterns of the measurement samples A, B1, and C which were obtained, FIGS. 27A, 27B, and 27C are nanobeam electron diffraction patterns of the measurement sample A, the measurement sample B1, and the measurement sample C, respectively. The nanobeam electron diffraction patterns in FIGS. 27A to 27C were observed with the use of an electron beam whose diameter was reduced to 1 nmϕ.

In FIGS. 27A to 27C, there are the following findings. In the measurement sample A which is a high-density CAAC-OS layer, spots are derived from crystallinity and arranged in an ordered manner. On the other hand, in the measurement sample C which is a low-density nanocrystalline oxide semiconductor layer, although spots of electron beams appear like spread halo pattern, nanocrystals remain partly. In the measurement sample B1 which is a medium-density nanocrystalline oxide semiconductor layer, spot-like patterns can be observed more clearly.

Accordingly, the above results show that a film has higher crystallinity as the film density gets higher. In other words, it is shown that a film having higher crystallinity can be obtained as the hydrogen concentration gets lower.

Further, localized levels (defect states) of the obtained measurement samples A, B1, and B2 were measured. Here, results of measuring the localized levels of the oxide semiconductor layers by constant photocurrent method (CPM) are described.

In the CPM measurement, the amount of light with which a surface of the measurement sample is irradiated is adjusted so that a photocurrent value is kept constant while voltage is applied between a pair of electrodes provided in contact with the oxide semiconductor layer, and then an absorption coefficient was derived from the amount of irradiation light in an intended wavelength range.

Figure 28:
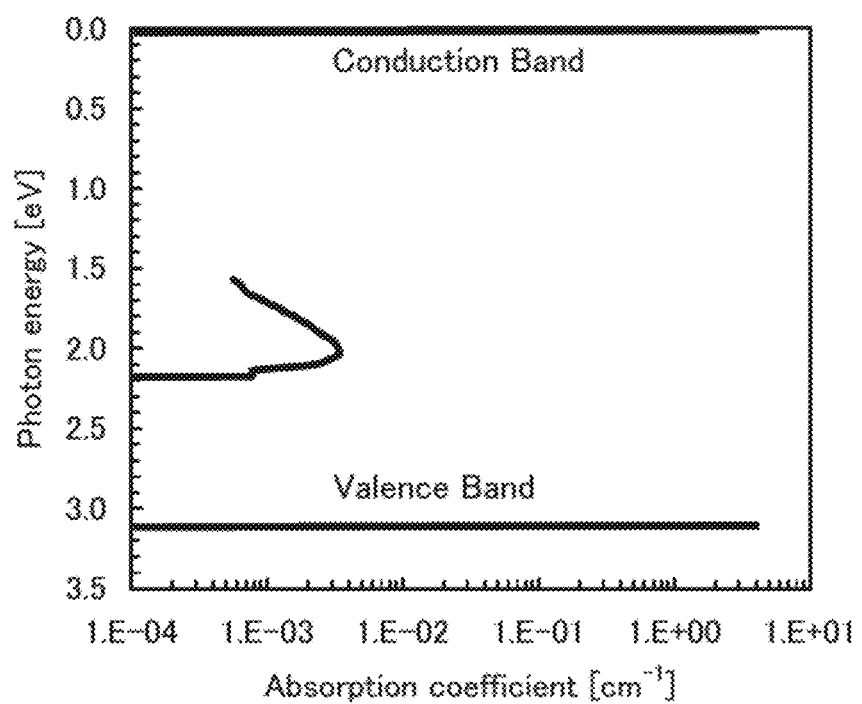
FIG. 28 shows the result of CPM measurement performed on an oxide semiconductor layer.
Figure 29A:
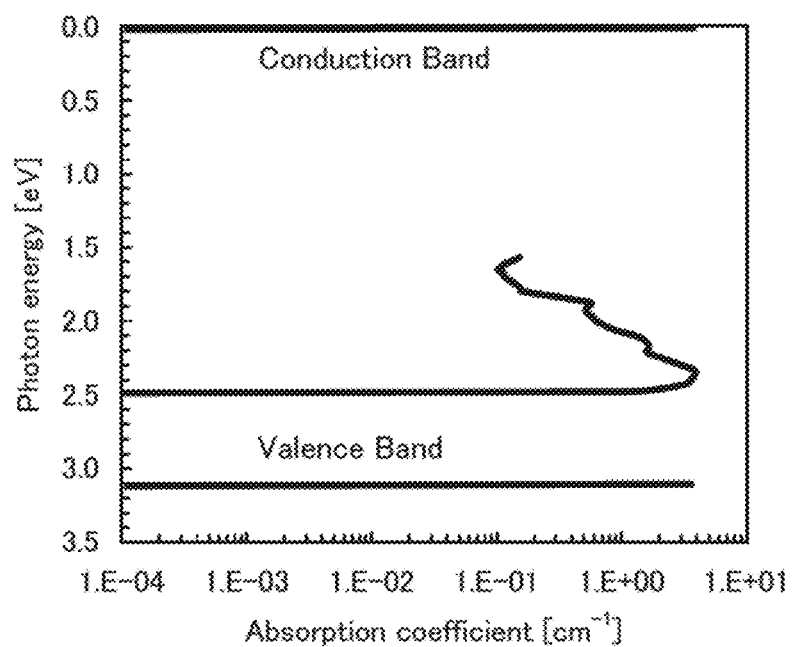
FIGS. 29A and 29B each show the result of CPM measurement performed on an oxide semiconductor layer.

An absorption coefficient shown in FIG. 28 was obtained by removing an absorption coefficient due to the band tail from the absorption coefficient obtained by the CPM measurement performed on the measurement sample A. That is, an absorption coefficient due to defects is shown in FIG. 28. An absorption coefficient shown in FIG. 29A was obtained by removing an absorption coefficient due to the band tail from the absorption coefficient obtained by the CPM measurement performed on the measurement sample B1. That is, an absorption coefficient due to defects is shown in FIG. 29A. An absorption coefficient shown in FIG. 29B was obtained by removing an absorption coefficient due to the band tail from the absorption coefficient obtained by the CPM measurement performed on the measurement sample B2. That is, an absorption coefficient due to defects is shown in FIG. 29B.

Figure 29B:
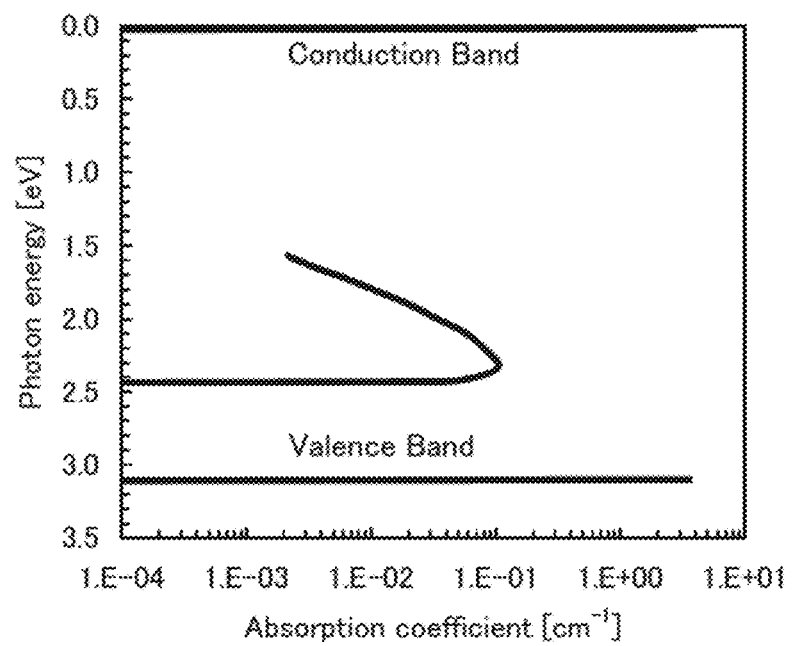

In FIG. 28 and FIGS. 29A and 29B, the horizontal axis indicates the absorption coefficient, and the vertical axis indicates the photon energy. The conduction band minimum energy and the valence band maximum energy of the oxide semiconductor layer are set to 0 eV and 3.15 eV respectively, on the vertical axis in FIG. 28 and FIGS. 29A and 29B. Each curve in FIG. 28 and FIGS. 29A and 29B represents a relation between the absorption coefficient and photon energy, which corresponds to defect states.

In the curve shown in FIG. 28, the absorption coefficient due to defect states was $5.86 \times 10^{-4}$/cm$^{-1}$. That is, the CAAC-OS film is a film with a low density of defect states where the absorption coefficient due to defect states is lower than $1 \times 10^{-3}$/cm, preferably lower than $1 \times 10^{-4}$/cm.

FIG. 29A shows that, in the measurement sample B1, the absorption coefficient due to defect states was $5.28 \times 10^{-1}$ cm$^{-1}$. FIG. 29B shows that, in the measurement sample B2, the absorption coefficient due to defect states was $1.75 \times 10^{-2}$ cm$^{-1}$. Thus, the heat treatment can reduce the number of defects in the oxide semiconductor layer.

According to the results obtained in the above manner, classification of crystal states of an oxide semiconductor (denoted by OS) is compared to silicon (denoted by Si), which are shown in Table 2.

TABLE 2

|  |  | Amorphous | Microcrystal | Polycrystal | Continuous crystal | Single crystal |
|---|---|---|---|---|---|---|
| OS |  | a-OS<br>a-OS:H | nc-OS<br>μc-OS | Polycrystalline OS | CAAC-OS | Single crystal OS |
|  | Nanobeam electron diffraction | Halo | Rmg + Spot | Spot | Spot | Spot |
|  | Crystal part | — | nm-μm | Discontinuous | Continuously connected | — |
|  | DOS | High | Slightly low | — | Low | Extremely low |
|  | Density | Low | Medium | — | High | — |

TABLE 2-continued

|  | Amorphous | Microcrystal | Polycrystal | Continuous crystal | Single crystal |
|---|---|---|---|---|---|
| Si | a-Si<br>a-Si:H | nc-Si<br>μc-Si | Polycrystalline Si | CG silicon | Single crystal Si |

As shown in Table 2, examples of oxide semiconductors having crystal structures include an amorphous oxide semiconductor (a-OS and a-OS:H), a microcrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 2, amorphous silicon (a-Si and a-Si:H), microcrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmϕ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the microcrystalline oxide semiconductor. Spots are observed in the polycrystalline oxide semiconductor. Spots are observed in the continuous crystal oxide semiconductor. Spots are observed in the single crystal oxide semiconductor.

According to the nanobeam electron diffraction pattern, a crystal part in the microcrystalline oxide semiconductor has a diameter of nanometers (nm) to micrometers (μm). The polycrystalline oxide semiconductor has discontinuous gain boundaries between crystal parts. No boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

The oxide semiconductor layer of one embodiment of the present invention includes a continuous crystalline oxide semiconductor with a low DOS as a channel which is a main current path, and includes a microcrystalline oxide semiconductor with a DOS lower than that of an amorphous oxide semiconductor at the interface between an insulating layer and the channel. Thus, a transistor including the oxide semiconductor layer can have high reliability.

REFERENCE NUMERALS

102: insulating layer, 104: oxide semiconductor layer, 104a: region, 104: region, 106: insulating layer, 114: oxide semiconductor layer, 114a: region, 114b: region, 124: oxide semiconductor layer, 124a: region, 124b: region, 124c: region, 250: memory cell, 251 memory cell array, 251a: memory cell array, 251b: memory cell array, 253: peripheral circuit, 254: capacitor, 260: transistor, 262: transistor, 264: capacitor, 300: transistor, 301: substrate, 302: gate electrode layer, 303: insulating layer, 304: oxide semiconductor layer, 304a: oxide semiconductor layer, 304b: oxide semiconductor layer, 305a: source electrode layer, 305b: drain electrode layer, 306: insulating layer, 307: insulating, layer, 310: transistor, 314: oxide semiconductor layer, 314a: oxide semiconductor layer, 314b: oxide semiconductor layer, 316a: source electrode layer, 316b: drain electrode layer, 320: transistor, 324: oxide semiconductor layer, 324a: oxide semiconductor layer, 324b: oxide semiconductor layer, 324c: oxide semiconductor layer, 350: transistor, 351: insulating layer, 352: insulating layer, 360: transistor, 364: oxide semiconductor layer, 364a: oxide semiconductor layer, 364b: oxide semiconductor layer, 364c: oxide semiconductor layer, 370: transistor, 402: insulating layer, 404: oxide semiconductor layer, 404a: oxide semiconductor layer, 404b: oxide semiconductor layer, 404c: oxide semiconductor layer, 410: insulating layer, 500: substrate, 501: pixel portion, 502: scan line driver circuit, 503: scan line driver circuit, 504: signal line driver circuit, 510: capacitor wiring, 512: gate wiring, 513: gate wiring, 514: drain electrode layer, 516: transistor, 517: transistor, 518: liquid crystal element, 519: liquid crystal element, 520: pixel, 521: switching transistor, 522: driver transistor, 523: capacitor, 524: light-emitting element, 525: signal line, 526: scan line, 527: power supply line, 528: common electrode, 801: transistor, 802: transistor, 803: transistor, 804: transistor, 811: transistor, 812: transistor, 813: transistor, 814: transistor, 901: RF circuit, 902: analog baseband circuit, 903: digital baseband circuit, 904: battery 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 1000: sputtering target, 1001: ion, 1002: sputtered particle, 1003: deposition surface, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera lens, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 1101: main body, 1102: housing, 1103a: display portion, 1103b: display portion, 1104: keyboard.

This application is based on Japanese Patent Application serial No. 2012-288288 filed with the Japan Patent Office on Dec. 28, 2012, the entire contents of which are hereby incorporated by reference.

The invention claimed is:

1. A semiconductor device comprising:
a first silicon oxide film;
a first oxide semiconductor film over the first silicon oxide film, the first oxide semiconductor film comprising a first metal element; and
a second oxide semiconductor film over the first oxide semiconductor film, the second oxide semiconductor film comprising the first metal element,
wherein the second oxide semiconductor film further comprises carbon or silicon as an impurity, and
wherein an electron diffraction pattern by electron diffraction with a beam diameter of 1 nmφ of the second oxide semiconductor film has a plurality of circumferentially arranged spots.

2. The semiconductor device according to claim 1, wherein the first oxide semiconductor film has a different composition from the second oxide semiconductor film.

3. The semiconductor device according to claim 1,
wherein each of the first oxide semiconductor film and the second oxide semiconductor film comprises indium, gallium and zinc,
wherein a concentration of the second oxide semiconductor film is higher than a concentration of the first oxide semiconductor film.

4. The semiconductor device according to claim 1,
wherein the second oxide semiconductor film comprises a first region and a second region, and
wherein the first region has a different degree of crystallinity from the second region.

5. The semiconductor device according to claim 1, wherein the impurity is carbon.

6. A displayer device comprising the semiconductor device according to claim 1.

7. The semiconductor device according to claim 1,
wherein the second oxide semiconductor film comprises indium, a second metal element and zinc,
wherein the second metal element is one of Al, Ti, Ga, Y, Zr, La, Ce, Nd and Hf,
wherein the first metal element is one of indium, the second metal element and zinc, and
wherein a proportion of indium is greater than or equal to 25 atomic % and a proportion of the first metal element is less than 75 atomic % when zinc and oxygen are eliminated from consideration.

8. The semiconductor device according to claim 7, further comprising:
a third oxide semiconductor film over the second oxide semiconductor film; and
a second silicon oxide film over the third oxide semiconductor film,
wherein the third oxide semiconductor film comprises one of indium, the second metal element and zinc.

9. The semiconductor device according to claim 1, wherein the first oxide semiconductor film has a different crystal structure from the second oxide semiconductor film.

10. The semiconductor device according to claim 9,
wherein the second oxide semiconductor film comprises a first region including a crystalline part, and
wherein an electron diffraction pattern by electron diffraction with a beam diameter of 1 nmφ of the second oxide semiconductor film has a plurality of spots which are arranged in an ordered manner.

11. A semiconductor device comprising:
a first silicon oxide film;
a first oxide semiconductor film over the first silicon oxide film, the first oxide semiconductor film comprising a first metal element; and
a second oxide semiconductor film over the first oxide semiconductor film, the second oxide semiconductor film comprising the first metal element,
wherein the second oxide semiconductor film further comprises carbon or silicon as an impurity,
wherein concentration of carbon or silicon is lower than or equal to $3 \times 10^{18}/cm^3$, and
wherein an electron diffraction pattern by electron diffraction with a beam diameter of 1 nmφ of the second oxide semiconductor film has a plurality of circumferentially arranged spots.

12. The semiconductor device according to claim 11, wherein the first oxide semiconductor film has a different composition from the second oxide semiconductor film.

13. The semiconductor device according to claim 11,
wherein the second oxide semiconductor film comprises a first region and a second region, and
wherein the first region has a different degree of crystallinity from the second region.

14. The semiconductor device according to claim 11, wherein the impurity is carbon.

15. A displayer device comprising the semiconductor device according to claim 11.

16. The semiconductor device according to claim 11, wherein the first oxide semiconductor film has a different crystal structure from the second oxide semiconductor film.

17. The semiconductor device according to claim 16,
wherein the second oxide semiconductor film comprises a first region including a crystalline part, and
wherein an electron diffraction pattern by electron diffraction with a beam diameter of 1 nmφ of the second oxide semiconductor film has a plurality of spots which are arranged in an ordered manner.

18. The semiconductor device according to claim 11,
wherein the second oxide semiconductor film comprises indium, a second metal element and zinc,
wherein the second metal element is one of Al, Ti, Ga, Y, Zr, La, Ce, Nd and Hf,
wherein the first metal element is one of indium, the second metal element and zinc, and
wherein a proportion of indium is greater than or equal to 25 atomic % and a proportion of the first metal element is less than 75 atomic % when zinc and oxygen are eliminated from consideration.

19. The semiconductor device according to claim 18, further comprising:
a third oxide semiconductor film over the second oxide semiconductor film; and
a second silicon oxide film over the third oxide semiconductor film,
wherein the third oxide semiconductor film comprises one of indium, the second metal element and zinc.

20. The semiconductor device according to claim 19, wherein the first oxide semiconductor film has a lower film density than the second oxide semiconductor film.

21. A semiconductor device comprising:
a first silicon oxide film;
a first oxide semiconductor film over the first silicon oxide film, the first oxide semiconductor film comprising a first metal element; and
a second oxide semiconductor film over the first oxide semiconductor film, the second oxide semiconductor film comprising the first metal element,
wherein an electron diffraction pattern by electron diffraction with a beam diameter of 1 nmφ of the second oxide semiconductor film has a plurality of circumferentially arranged spots.

* * * * *